(12) United States Patent
Huang et al.

(10) Patent No.: US 10,991,728 B2
(45) Date of Patent: Apr. 27, 2021

(54) DISPLAY PANEL

(71) Applicant: Au Optronics Corporation, Hsinchu (TW)

(72) Inventors: Shin-Wei Huang, Hsinchu (TW); Chia-Ching Lu, Hsinchu (TW); Min-Hsiang Hung, Tainan (TW); Chen-Shun Tsai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/594,098

(22) Filed: Oct. 7, 2019

(65) Prior Publication Data

US 2020/0166793 A1 May 28, 2020

Related U.S. Application Data

(60) Provisional application No. 62/771,264, filed on Nov. 26, 2018.

(30) Foreign Application Priority Data

Dec. 27, 2018 (TW) .................................. 107147447

(51) Int. Cl.
*H01L 27/12* (2006.01)
*H01L 23/498* (2006.01)
*H01L 21/66* (2006.01)
(Continued)

(52) U.S. Cl.
CPC ........ *H01L 27/124* (2013.01); *G02F 1/13452* (2013.01); *H01L 22/34* (2013.01); *H01L 23/4985* (2013.01); *G02F 1/1339* (2013.01)

(58) Field of Classification Search
CPC ..................................................... H01L 27/124
See application file for complete search history.

(56) References Cited

U.S. PATENT DOCUMENTS 6,327,443 B1 * 12/2001 Sekiguchi ............. G02F 1/1345
257/59
6,714,274 B2 * 3/2004 Aoki ................... G02F 1/13454
257/59

(Continued)

FOREIGN PATENT DOCUMENTS

| CN | 101833183 | 2/2012 |
| CN | 103493119 | 1/2014 |
| CN | 205103795 | 3/2016 |

*Primary Examiner* — William A Harriston
(74) *Attorney, Agent, or Firm* — JCIPRNET

(57) ABSTRACT

A display panel includes a first substrate, a second substrate, a sealant, a signal line, and a turning line. The signal line includes first to nth signal lines substantially extending along a first direction. The turning line includes first to mth turning lines substantially extending along a second direction. A common boundary between the turning line and the signal line is parallel with a third direction. A first auxiliary region is defined by the first direction, a fourth direction perpendicular to the first direction, and the third direction. One side of the first auxiliary region overlaps the common boundary. Two vertices of the first auxiliary region overlap the first signal line and the other vertex overlaps the nth signal line. A vertical projection area of the signal line in the first auxiliary region is A1, an area of the first auxiliary region is B1, and 60%≤A1/B1≤100%.

24 Claims, 17 Drawing Sheets

(51) Int. Cl.
*G02F 1/1345* (2006.01)
*G02F 1/1339* (2006.01)

(56) References Cited

U.S. PATENT DOCUMENTS

| | | | |
|---|---|---|---|
| 7,068,338 B2* | 6/2006 | Taguchi | G02F 1/1345 349/149 |
| 7,251,009 B2* | 7/2007 | Hayata | G09G 3/006 349/149 |
| 7,315,297 B2* | 1/2008 | Murade | G09G 5/006 345/206 |
| 7,349,055 B2* | 3/2008 | Lee | G02F 1/1345 349/149 |
| 7,372,514 B2* | 5/2008 | Matsumoto | H01L 27/124 349/55 |
| 7,525,625 B2* | 4/2009 | Aoki | G02F 1/136286 349/139 |
| 7,705,951 B2* | 4/2010 | Takenaka | G02F 1/13452 349/150 |
| 8,780,287 B2* | 7/2014 | Liu | H04N 13/305 349/15 |
| 9,316,858 B2 | 4/2016 | Yabuta et al. | |
| 10,353,254 B2* | 7/2019 | Masui | H05K 1/0219 |
| 10,593,707 B2* | 3/2020 | Li | G09G 3/3688 |
| 10,839,761 B2* | 11/2020 | Aoki | G09G 3/3688 |
| 2006/0092341 A1* | 5/2006 | Huang | G02F 1/136213 349/38 |
| 2010/0079716 A1* | 4/2010 | Nakagawa | G02F 1/136286 349/149 |
| 2014/0043569 A1 | 2/2014 | Yabuta et al. | |
| 2020/0168632 A1* | 5/2020 | Huang | H01L 22/34 |

* cited by examiner

DISPLAY PANEL

CROSS-REFERENCE TO RELATED APPLICATION

This application claims the priority benefits of U.S. provisional application Ser. No. 62/771,264, filed on Nov. 26, 2018, and Taiwan application serial no. 107147447, filed on Dec. 27, 2018. The entirety of each of the above-mentioned patent applications is hereby incorporated by reference herein and made a part of this specification.

BACKGROUND

Field of the Invention

The present invention relates to a display panel, and in particular, to a display panel including a sealant.

Description of Related Art

At present, most liquid crystal display devices on the market have an upper substrate, a lower substrate, and a liquid crystal layer between the two substrates. In general, the liquid crystal display device further includes a sealant that bonds the upper substrate and the lower substrate together. The sealant surrounds the liquid crystal layer to prevent liquid crystals from flowing out from the side of a liquid crystal display panel.

In the existing technology, a plurality of slits may be provided on a trace overlapping the sealant. That is to say, each trace is composed of a plurality of thin lines arranged side by side, whereby light may pass through the slits between the thin lines to cure the sealant overlapping a guide line. However, with the advancement of science and technology, circuit layout space of liquid crystal display devices is decreasing, and the trace has a decreasing line width. The trace overlapping the sealant is prone to burning due to the small line width, wherein especially a turning region of the trace is more likely to be burned due to concentration of energy.

SUMMARY OF THE INVENTION

The present invention provides a display panel which improves a problem that a trace overlapping a sealant is burned in a turning region thereof.

An embodiment of the present invention provides a display panel. The display panel includes a first substrate, a second substrate, a sealant, a signal line, and a turning line. The second substrate is provided opposite to the first substrate. The sealant is located between the first substrate and the second substrate. The signal line is located on the first substrate, and includes a first signal line to an nth signal line substantially extending along a first direction, n being a positive integer and being greater than or equal to 2. The turning line is connected to the signal line. The turning line includes first to mth turning lines substantially extending along a second direction, m being a positive integer and being greater than or equal to 2. A common boundary between the turning line and the signal line is substantially parallel with a third direction. The signal line overlaps the turning line and the sealant in a direction perpendicular to the first substrate. A first auxiliary region is defined by the first direction, a fourth direction perpendicular to the first direction, and the third direction. One side of the first auxiliary region overlaps the common boundary. Two vertices of the first auxiliary region overlap the first signal line. The other vertex of the first auxiliary region overlaps the nth signal line. The signal line further includes a first auxiliary electrode in the first auxiliary region. The first auxiliary electrode is provided between the first and nth signal lines and the common boundary, and is connected to at least one of the first signal line to the nth signal line. A vertical projection area of the signal line in the first auxiliary region is A1, an area of the first auxiliary region is B1, and 60%≤A1/B1≤100%.

An embodiment of the present invention provides a display panel. The display panel includes a first substrate, a second substrate, a sealant, a signal line, and a turning line. The second substrate is provided opposite to the first substrate. The sealant is located between the first substrate and the second substrate. The signal line is located on the first substrate. The signal line includes a first signal line to an nth signal line substantially extending along a first direction, n being a positive integer and being greater than or equal to 2. The signal line overlaps the turning line and the sealant in a direction perpendicular to the first substrate. Line widths of the first signal line to the nth signal line are $C_1$ to $C_n$, respectively. Spacing between an ath signal line and an (a+1)th signal line is $X_a$, a being an integer of 1 to (n−1). The turning line is connected to the signal line. The turning line includes a first turning line to an mth turning line substantially extending along a second direction, m being a positive integer and being greater than or equal to 2. Line widths of the first turning line to the mth turning line are $D_1$ to $D_m$, respectively. Spacing between a bth turning line and a (b+1)th turning line is $Z_b$, b being an integer of 1 to (m−1). The display panel satisfies at least one of $$\sum_{w=1}^{m} Dw > \sum_{w=1}^{n} Cw \text{ and } Z_b > X_a, \text{ and } \frac{X_{n-1}}{C_n + X_{n-1}} \geq 30\%.$$

In order to make the aforementioned and other objectives and advantages of the present invention comprehensible, embodiments accompanied with figures are described in detail below.

DESCRIPTION OF THE EMBODIMENTS

Figure 1:
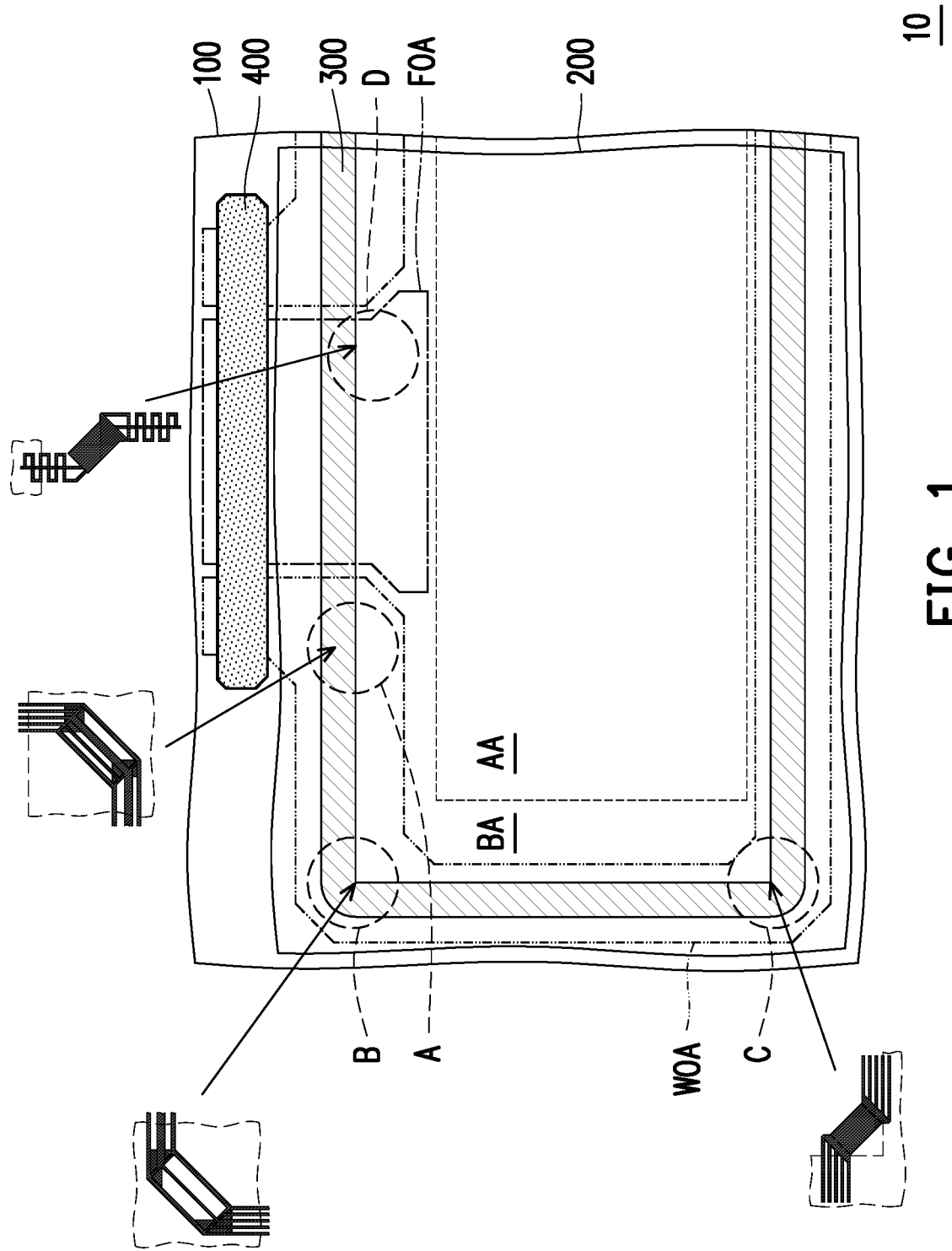
FIG. 1 is a schematic top view of a display panel according to an embodiment of the present invention.

FIG. 1 is a schematic view of a display panel according to an embodiment of the present invention. FIG. 1 omits a trace on a first substrate, and a pixel structure and a display medium in a display area.

Referring to FIG. 1, a display panel 10 includes a first substrate 100, a second substrate 200, a sealant 300, and a driving control unit 400. The second substrate 200 is provided opposite to the first substrate 100. The sealant 300 is located between the first substrate 100 and the second substrate 200. The sealant 300 is a photocurable material.

The first substrate 100 has thereon a display area AA and a peripheral area BA located on at least one side of the display area AA. The peripheral area BA includes wire on array areas WOA and fan-out areas FOA. The wire on array area WOA and the fan-out area FOA each include a plurality of traces. The driving control unit 400 is located on the first substrate 100, and electrically connected to the traces on the wire on array area WOA and the fan-out area FOA. A schematic enlarged top view of a region A may be, for example, FIG. 2J. A schematic enlarged top view of a region B may be, for example, FIG. 3. A schematic enlarged top view of a region C may be, for example, FIG. 4. A schematic enlarged top view of a region D may be, for example, FIG. 5A.

Figure 2A:
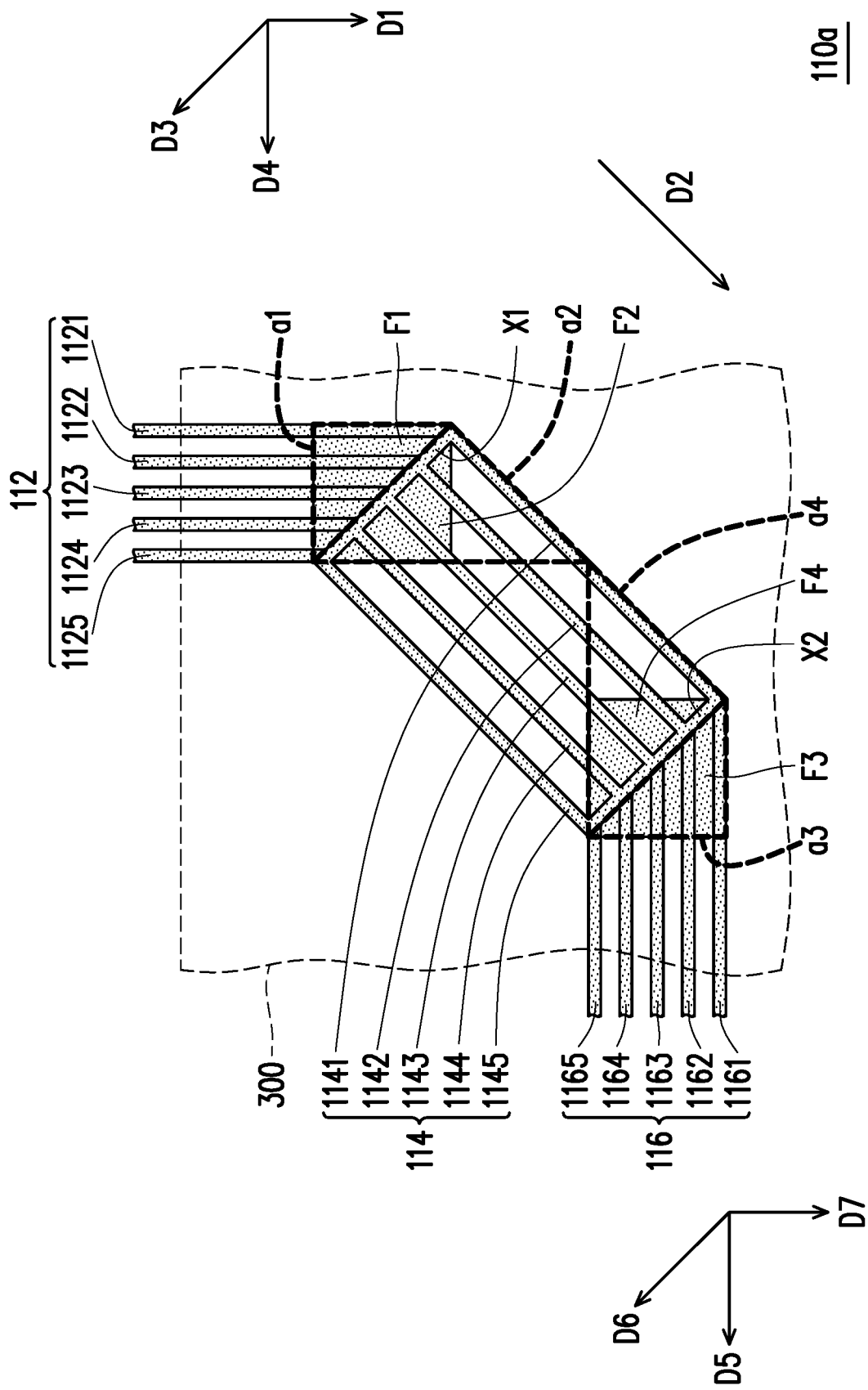
FIG. 2A is a schematic top view of one of traces in a region A of FIG. 1.

FIG. 2A is a schematic top view of one of traces in the region A of FIG. 1. Referring to FIG. 1 and FIG. 2A, a trace 110a is located in the region A of the wire on array area WOA. The trace 110a includes a signal line 112, a turning line 114 and a guide line 116 connected in sequence. The signal line 112, the turning line 114 and the guide line 116 are located on the first substrate 100. The signal line 112, the turning line 114 and the guide line 116 overlap the sealant 300 in a direction perpendicular to the first substrate 100. The signal line 112 is closer to the driving control unit 400 than the turning line 114, and the turning line 114 is closer to the driving control unit 400 than the guide line 116.

The signal line 112 includes a first signal line to an nth signal line substantially extending along a first direction D1, n being a positive integer and n being greater than or equal to 2. The first to nth signal lines are arranged in sequence. In the present embodiment, n is equal to 5. The signal line 112 includes, but is not limited to, a first signal line 1121, a second signal line 1122, a third signal line 1123, a fourth signal line 1124, and a fifth signal line 1125.

The turning line 114 is connected to the signal line 112. The turning line 114 includes a first turning line to an mth turning line substantially extending along a second direction D2, m being a positive integer and m being greater than or equal to 2. The first to mth turning lines are arranged in sequence. In the present embodiment, m is equal to 5. The turning line 114 includes, but is not limited to, a first turning line 1141, a second turning line 1142, a third turning line 1143, a fourth turning line 1144, and a fifth turning line 1145. A common boundary X1 between the turning line 114 and the signal line 112 is substantially parallel with a direction D3. The direction D3 is different from the direction D1, the direction D2, and a direction D4 perpendicular to the direction D1.

The guide line 116 is connected to the turning line 114. The turning line 114 is located between the guide line 116 and the signal line 112. The guide line 116 includes a first guide line to a kth guide line substantially extending along a direction D5, k being a positive integer and k being greater than or equal to 2. n, m, and k may be equal or unequal. The first to kth guide lines are arranged in sequence. In the present embodiment, k is equal to 5. The guide line 116 includes, but is not limited to, a first guide line 1161, a second guide line 1162, a third guide line 1163, a fourth guide line 1164, and a fifth guide line 1165. A common boundary X2 between the turning line 114 and the guide line 116 is substantially parallel with a direction D6. The direction D6 is different from the direction D5, the direction D2, and a direction D7 perpendicular to the direction D5.

In some embodiments, the signal line 112 further includes an auxiliary line (not shown) extending along the direction D4. The auxiliary line connects the first signal line to the nth signal line to make electrical properties on the first signal line to the nth signal line distributed more uniformly. In some embodiments, the guide line 116 further includes an auxiliary line (not shown) extending along the direction D7. The auxiliary line connects the first guide line to the kth guide line to achieve a more uniform distribution of electrical properties on the first guide line to the kth guide line.

A length of the turning line 114 is less than a length of the signal line 112 and a length of the guide line 116. The common boundary X1 is close to the common boundary X2. Therefore, when a current is supplied, energy is easily concentrated at a portion of the turning line 114.

A first auxiliary region a1 is defined by the direction D1, the direction D4 perpendicular to the direction D1, and the direction D3. One side of the first auxiliary region a1 overlaps the common boundary X1. Two vertices of the first auxiliary region a1 overlap the first signal line 1121 and the other vertex of the first auxiliary region a1 overlaps the nth signal line (fifth signal line 1125). The signal line 112 further includes a first auxiliary electrode F1 in the first auxiliary region a1. The first auxiliary electrode F1 is provided between the first signal line 1121 and the nth signal line (fifth signal line 1125) and the common boundary X1. The first auxiliary electrode F1 is connected to at least one of the first signal line 1121 to the nth signal line (fifth signal line 1125). The shape of the first auxiliary electrode F1 in the first auxiliary region a1 may be adjusted according to actual needs.

A vertical projection area of the signal line 112 including the first signal line 1121 to the nth signal line (fifth signal line 1125) and the first auxiliary electrode F1 in the first auxiliary region a1 is A1, an area of the first auxiliary region a1 is B1, and 60%≤A1/B1≤100%. For example, 65%≤A1/B1≤100%, 70%≤A1/B1≤100%, or 75%≤A1/B1≤100%. In some embodiments, a vertical projection area of the first auxiliary electrode F1 in the first auxiliary region a1 is C1, and 5%≤C1/B1≤50%. For example, 10%≤C1/B1≤45%, and 15%≤C1/B1≤40%. It is to be noted that the foregoing areas refer to area of vertical projection on the first substrate 100.

A second auxiliary region a2 is defined by the direction D1, the direction D2, and the direction D3. One side of the second auxiliary region a2 overlaps the common boundary X1. Two vertices of the second auxiliary region a2 overlap the first turning line 1141. The other vertex of the second auxiliary region a2 overlaps the mth turning line (fifth turning line 1145). The turning line 114 further includes a second auxiliary electrode F2 in the second auxiliary region a2. The second auxiliary electrode F2 is provided between the first turning line 1141 and the mth turning line (fifth turning line 1145) and the common boundary X1. The second auxiliary electrode F2 is connected to at least one of the first turning line 1141 to the mth turning line (fifth turning line 1145). The shape of the second auxiliary electrode F2 in the second auxiliary region a2 may be adjusted according to actual needs.

A vertical projection area of the turning line 114 including the first turning line 1141 to the mth turning line (fifth turning line 1145) and the second auxiliary electrode F2 in the second auxiliary region a2 is A2, an area of the second auxiliary region a2 is B2, and 60%≤A2/B2≤100%. For example, 65%≤A2/B2≤100%, 70%≤A2/B2≤100%, or 75%≤A2/B2≤100%. In some embodiments, a vertical projection area of the second auxiliary electrode F2 in the second auxiliary region a2 is C2, and 5%≤C2/B2≤50%. For example, 10%≤C2/B2≤45%, and 15%≤C2/B2≤40%. It is to be noted that the foregoing areas refer to, for example, area of vertical projection on the first substrate 100.

A third auxiliary region a3 is defined by the direction D5, the direction D7 perpendicular to the direction D5, and the direction D6. One side of the third auxiliary region a3 overlaps the common boundary X2. Two vertices of the third auxiliary region a3 overlap the first guide line 1161 and the other vertex of the third auxiliary region a3 overlaps the kth guide line (fifth guide line 1165). The guide line 116 further includes a third auxiliary electrode F3 in the third auxiliary region a3. The third auxiliary electrode F3 is provided between the first guide line 1161 and the kth guide line (fifth guide line 1165) and the common boundary X2. The third auxiliary electrode F3 is connected to at least one of the first guide line 1161 to the kth guide line (fifth guide line 1165). The shape of the third auxiliary electrode F3 in the third auxiliary region a3 may be adjusted according to actual needs.

A vertical projection area of the guide line 116 including the first guide line 1161 to the kth guide line (fifth guide line 1165) and the third auxiliary electrode F3 in the third auxiliary region a3 is A3a an area of the third auxiliary region a3 is B3, and 60%≤A3/B3≤100%. For example, 65%≤A3/B3≤100%, 70%≤A3/B3≤100%, or 75%≤A3/B3≤100%. In some embodiments, a vertical projection area of the third auxiliary electrode F3 in the third auxiliary region a3 is C3, and 5%≤C3/B3≤50%. For example, 10%≤C3/B3≤45%, and 15%≤C3/B3≤40%. It is to be noted that the foregoing areas refer to, for example, area of vertical projection on the first substrate 100.

A fourth auxiliary region a4 is defined by the direction D5, the direction D2, and the direction D6. One side of the fourth auxiliary region a4 overlaps the common boundary X2. Two vertices of the fourth auxiliary region a4 overlap the first turning line 1141. The other vertex of the fourth auxiliary region a4 overlaps the mth turning line (fifth turning line 1145). The turning line 114 further includes a fourth auxiliary electrode F4 in the fourth auxiliary region a4. The fourth auxiliary electrode F4 is provided between the first turning line 1141 and the mth turning line (fifth turning line 1145) and the common boundary X2. The fourth auxiliary electrode F4 is connected to at least one of the first turning line 1141 to the mth turning line (fifth turning line 1145).

A vertical projection area of the turning line 114 including the first turning line 1141 to the mth turning line (fifth turning line 1145) and the fourth auxiliary electrode F4 in the fourth auxiliary region a4 is A4, an area of the fourth auxiliary region a4 is B4, and 60%≤A4/B4≤100%. For example, 65%≤A4/B4≤100%, 70%≤A4/B4≤100%, or 75%≤A4/B4≤100%. In some embodiments, a vertical projection area of the fourth auxiliary electrode F4 in the fourth auxiliary region a4 is C4, and 5%≤C4/B4≤50%. For example, 10%≤C4/B4≤45%, and 15%≤C4/B4≤40%. It is to be noted that the foregoing areas refer to, for example, area of vertical projection on the first substrate 100.

In the present embodiment, the second auxiliary region a2 is separated from the fourth auxiliary region a4, but the present invention is not limited thereto. In other embodiments, the second auxiliary region a2 overlaps the fourth auxiliary region a4. Therefore, in some embodiments, the second auxiliary electrode F2 and the fourth auxiliary electrode F4 may share a partial area.

In the present embodiment, the first auxiliary electrode F1, the second auxiliary electrode F2, the third auxiliary electrode F3, and the fourth auxiliary electrode F4 are respectively provided in the first auxiliary region a1, the second auxiliary region a2, the third auxiliary region a3, and the fourth auxiliary region a4. The auxiliary electrodes are provided in a range not extending beyond their corresponding auxiliary regions. However, the present invention is not limited thereto. In other embodiments, the auxiliary electrodes are provided in a range extending beyond their corresponding auxiliary regions.

Based on the above, by providing an auxiliary electrode at a turning portion of a trace, the problem that a turning region is burned can be alleviated.

Figure 2B:
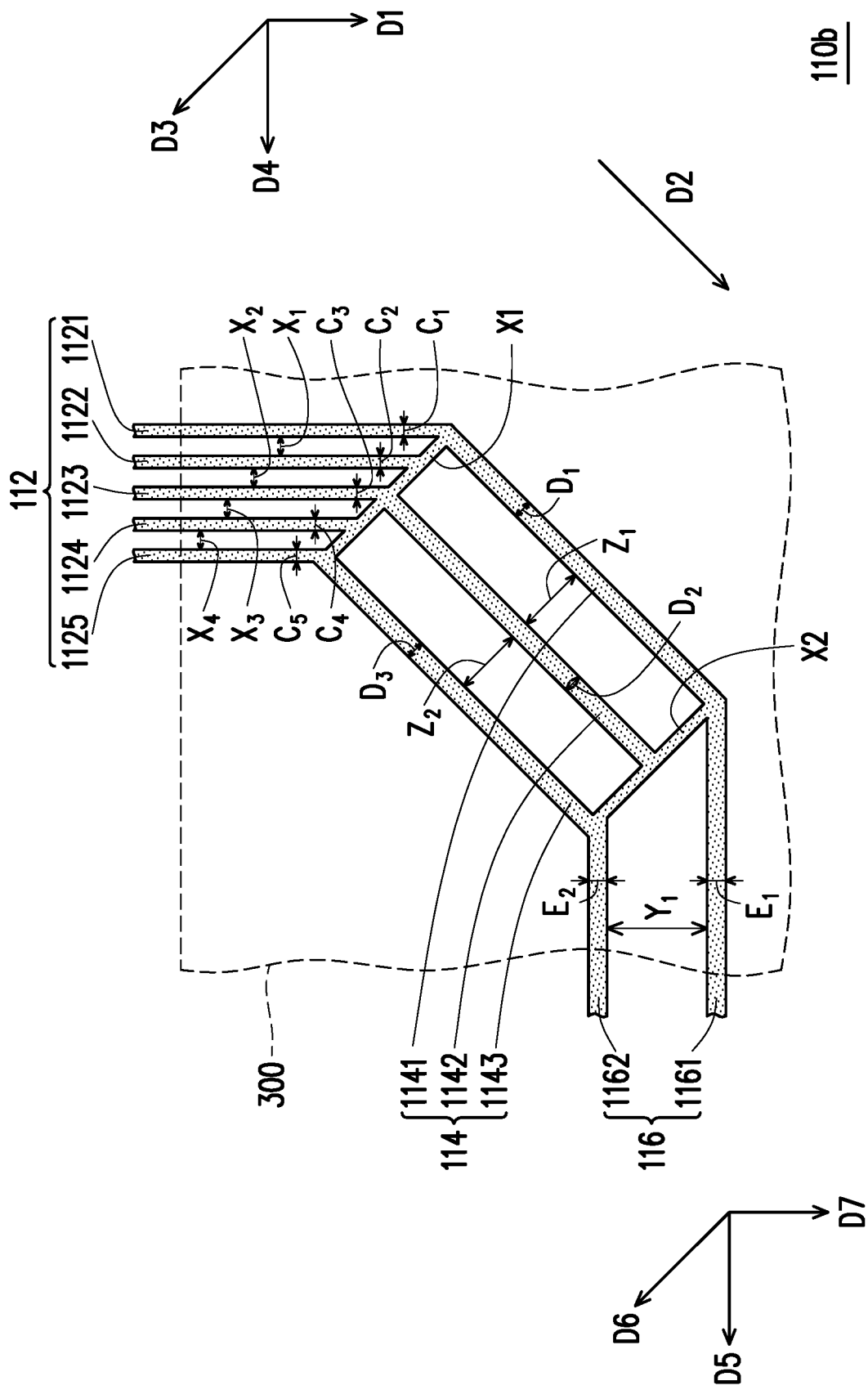
FIG. 2B is a schematic top view of a trace according to an embodiment of the present invention.

FIG. 2B is a schematic top view of a trace according to the present invention. For example, FIG. 2B is a schematic top view of one of the traces in the region A of FIG. 1. A trace 110b of FIG. 2B is similar to the trace 110a of FIG. 2A. The same or similar contents are omitted herein. The trace 110b of FIG. 2B and the trace 110a of FIG. 2A may be different traces in the same display panel, or may be traces in different display panels.

Referring to FIG. 1A and FIG. 2B, the signal line 112 includes a first signal line to an nth signal line. In the present embodiment, n is equal to 5. Line widths of the first signal line 1121 to the nth signal line (fifth signal line 1125) are $C_1$ to $C_n$ ($C_5$), respectively. Spacing between an ath signal line and a (a+1)th signal line is $X_a$, a being a positive integer of 1 to (n−1). In the present embodiment, a is 1 to 4. The spacing between the first signal line 1121 and the second signal line 1122 is $X_1$. The spacing between the second signal line 1122 and the third signal line 1123 is $X_2$. The spacing between the third signal line 1123 and the fourth signal line 1124 is $X_3$. The spacing between the fourth signal line 1124 and the fifth signal line 1125 is $X_4$.

The turning line 114 includes the first turning line 1141 to the mth turning line. In the present embodiment, m is equal to 3. Line widths of the first turning line 1141 to the mth turning line (third turning line 1143) are $D_1$ to $D_m$ ($D_3$), respectively. Spacing between a bth turning line and a (b+1)th turning line is $Z_b$, b being a positive integer of 1 to (m−1). In the present embodiment, b is 1 or 2. The spacing between the first turning line 1141 and the second turning line 1142 is $Z_1$. The spacing between the second turning line 1142 and the third turning line 1143 is $Z_2$.

The guide line 116 includes the first guide line 1161 to the kth guide line. In the present embodiment, k is equal to 2. Line widths of the first guide line 1161 to the kth guide line (second guide line 1162) are $E_1$ to $E_k$ ($E_2$), respectively. Spacing between a cth guide line and a (c+1)th guide line is $Y_c$, c being a positive integer of 1 to (k−1). In the present embodiment, c is 1. The spacing between the first guide line 1161 and the second guide line 1162 is $Y_1$.

The line widths $C_1$ to $C_n$, the line widths $D_1$ to $D_m$, and the line widths $E_1$ to $E_k$ may be equal or unequal. In the present embodiment, the line widths $C_1$ to $C_5$ are each 1 μm. In the present embodiment, the line widths $D_1$ to $D_3$ are ⅗ μm. In the present embodiment, the line width $E_1$ and the line width $E_2$ are 1.5 μm.

In an exemplary embodiment, the signal line 112, the turning line 114, and the guide line 116 satisfy Formula 1 and Formula 2.

$$0.7 \leq \frac{\sum_{w=1}^{n} Cw}{\sum_{w=1}^{m} Dw} \leq 1.3 \qquad \text{Formula 1}$$

$$0.7 \leq \frac{\sum_{w=1}^{k} Ew}{\sum_{w=1}^{m} Dw} \leq 1.3 \qquad \text{Formula 2}$$

In traces satisfying Formula 1 and/or Formula 2, a line width change rate of the signal line 112, the turning line 114, and the guide line 116 is limited to a certain ratio. Therefore, signals on the traces are hardly affected by the line widths.

The spacing $X_1$ to the spacing $X_{n-1}$, the spacing $Z_1$ to the spacing $Z_{m-1}$, and the spacing $Y_1$ to the spacing $Y_{k-1}$ may be equal or unequal. In the present embodiment, the spacing $X_1$ to the spacing $X_4$ are 2 μm. In the present embodiment, the spacing $Z_1$ and the spacing $Z_2$ are 4 μm. In the present embodiment, the spacing $Z_1$ and the spacing $Y_1$ are 8 μm.

In the present embodiment, the trace 110b of a display device satisfies at least one of Formula 3 and Formula 4.

$$\sum_{w=1}^{m} Dw > \sum_{w=1}^{n} Cw \qquad \text{Formula 3}$$

$$Z_b > X_a \qquad \text{Formula 4}$$

In some embodiments, the trace 110b satisfies Formula 3. In other words, a total line width of the first turning line 1141 to the mth turning line (third turning line 1143) is greater than a total line width of the first signal line 1121 to the nth signal line (fifth signal line 1125). Therefore, the turning line may withstand higher currents, and is less likely to be burned.

In some embodiments, the trace 110b satisfies Formula 4. In other words, the spacing between adjacent ones of the first turning line 1141 to the mth turning line (third turning line 1143) is greater than the spacing between adjacent ones of the first signal line 1121 to the nth signal line (fifth signal line 1125). For example, in the present embodiment, the spacing $Z_1$ is greater than the spacing $X_1$, the spacing $Z_1$ is greater than the spacing $X_2$, the spacing $Z_1$ is greater than the spacing $X_3$, and the spacing $Z_1$ is greater than the spacing $X_4$. The spacing $Z_2$ is greater than the spacing $X_1$, the spacing $Z_2$ is greater than the spacing $X_2$, the spacing $Z_2$ is greater than the spacing $X_3$, and the spacing $Z_2$ is greater than the spacing $X_4$. By controlling the spacing between adjacent ones of the first turning line 1141 to the mth turning line (third turning line 1143), heat dissipation of the turning line 114 is improved, and the turning line 114 is less likely to be burned. Therefore, even if the total line width of the first signal line 1121 to the nth signal line (fifth signal line 1125) is greater than the total line width of the first turning line 1141 to the mth turning line (third turning line 1143), the turning line 114 is still less likely to be burned.

In the present embodiment, the trace 110b of the display device satisfies Formula 5.

$$\frac{X_{n-1}}{C_n + X_{n-1}} \geq 30\% \qquad \text{Formula 5}$$

By adjusting a ratio of the line width $C_n$ to the spacing $X_{n-1}$, the sealant 300 overlapping the trace 110a can be cured more completely.

In some embodiments, the trace 110b of the display device selectively satisfies Formula 6 and Formula 7.

$$\frac{Z_{m-1}}{D_m + Z_{m-1}} \geq 30\% \qquad \text{Formula 6}$$

$$\frac{Y_{k-1}}{E_k + Y_{k-1}} \geq 30\% \qquad \text{Formula 7}$$

By adjusting a ratio of the line width $D_m$ to the spacing $Z_{m-1}$ and adjusting a ratio of the line width $E_k$ to the spacing $Y_{k-1}$, the sealant 300 overlapping the trace 110a can further be cured completely.

Figure 2C:
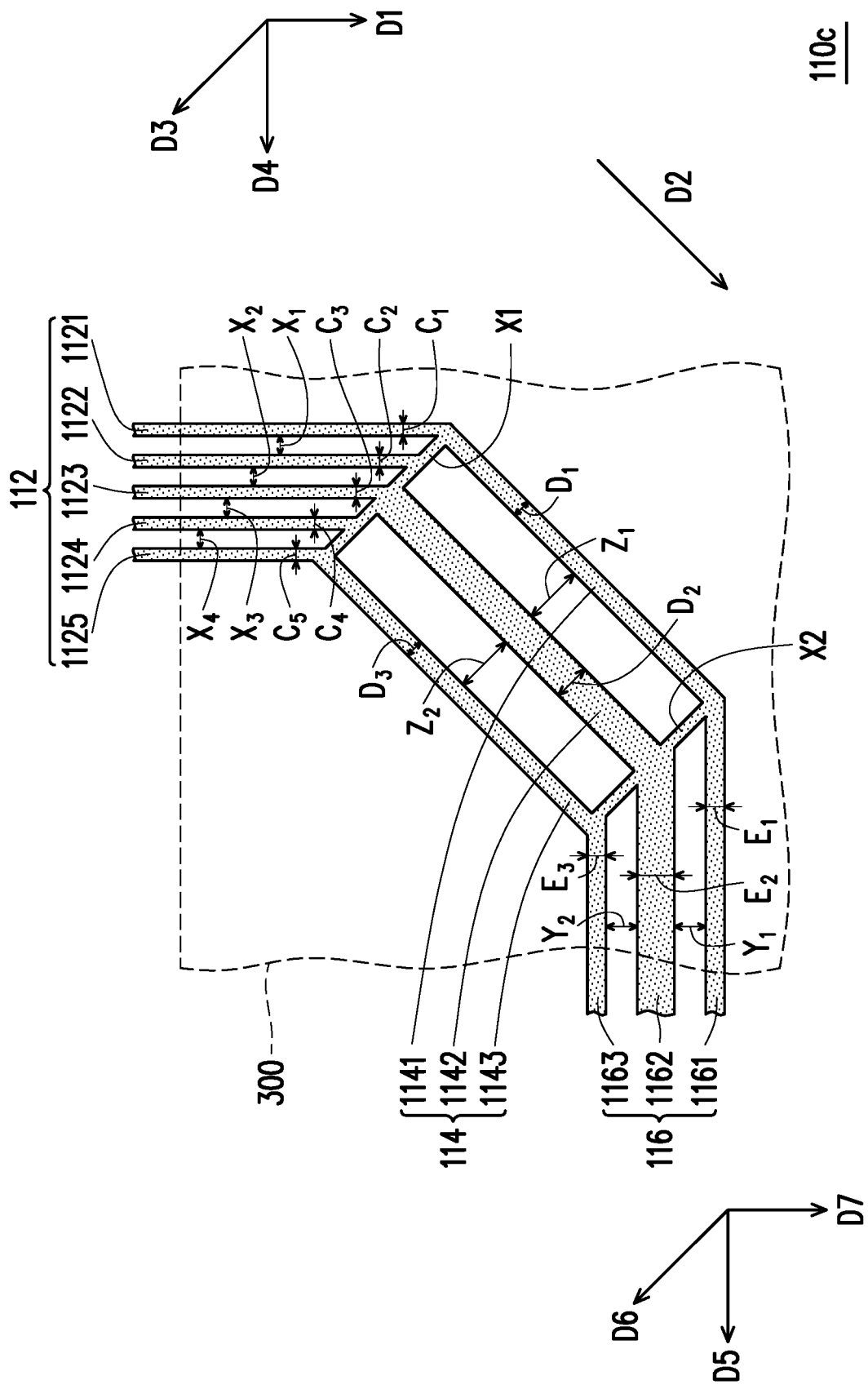
FIG. 2C is a schematic top view of a trace according to an embodiment of the present invention.

FIG. 2C is a schematic top view of a trace according to the present invention. For example, FIG. 2C is a schematic top view of one of the traces in the region A of FIG. 1. A trace 110c of FIG. 2C is similar to the trace 110b of FIG. 2B. The same or similar contents are omitted herein. The trace 110c of FIG. 2C and the trace 110b of FIG. 2B may be different traces in the same display panel, or may be traces in different display panels.

Referring to FIG. 2C, the signal line 112 includes the first signal line 1121 to the fifth signal line 1125.

The turning line 114 includes the first turning line 1141 to the third turning line 1143.

The guide line 116 includes the first guide line 1161 to the kth guide line. In the present embodiment, k is equal to 3. Line widths of the first guide line 1161 to the kth guide line (third guide line 1163) are $E_1$ to $E_k$ ($E_3$), respectively. The spacing between the cth guide line and the (c+1)th guide line is $Y_c$, c being 1 to (k−1). In the present embodiment, c is 1 to 2. The spacing between the first guide line 1161 and the second guide line 1162 is $Y_1$. The spacing between the second guide line 1162 and the third guide line 1163 is $Y_2$.

The line widths $C_1$ to $C_n$, the line widths $D_1$ to $D_m$, and the line widths $E_1$ to $E_k$ may be equal or unequal. In the present embodiment, the line widths $C_1$ to $C_5$ are each 1 μm. In the present embodiment, the line width $D_1$ and the line width $D_3$ are 1.5 μm, and the line width $D_2$ is 3 μm. In the present embodiment, the line width $E_1$ and the line width $E_3$ are 1 μm, and the line width $E_2$ is 3 μm. In other words, the trace 110c of the present embodiment satisfies the foregoing Formula 3, which can improve the problem of trace burning.

In some embodiments, m is greater than or equal to 3. For example, in the present embodiment, m is equal to 3. The second turning line 1142 is located between the first turning line 1141 and the mth turning line (third turning line 1143).

The line width $D_2$ of the second turning line 1142 is greater than the line width $D_1$ of the first turning line 1141 and the line width $D_m$ ($D_3$) of the mth turning line (third turning line 1143). Whereby, the problem of trace burning can further be alleviated.

The spacing $X_1$ to the spacing $X_{n-1}$, the spacing $Z_1$ to the spacing $Z_{m-1}$, and the spacing $Y_1$ to the spacing $Y_{k-1}$ may be equal or unequal. In the present embodiment, the spacing $X_1$ to the spacing $X_4$ are 2 μm. In the present embodiment, the spacing $Z_1$ and the spacing $Z_2$ are 2.5 μm. In the present embodiment, the spacing $Y_1$ and the spacing $Y_2$ are 2.5 μm. In other words, the trace 110c of the present embodiment satisfies the foregoing Formula 4, which can improve the problem of trace burning.

Figure 2D:
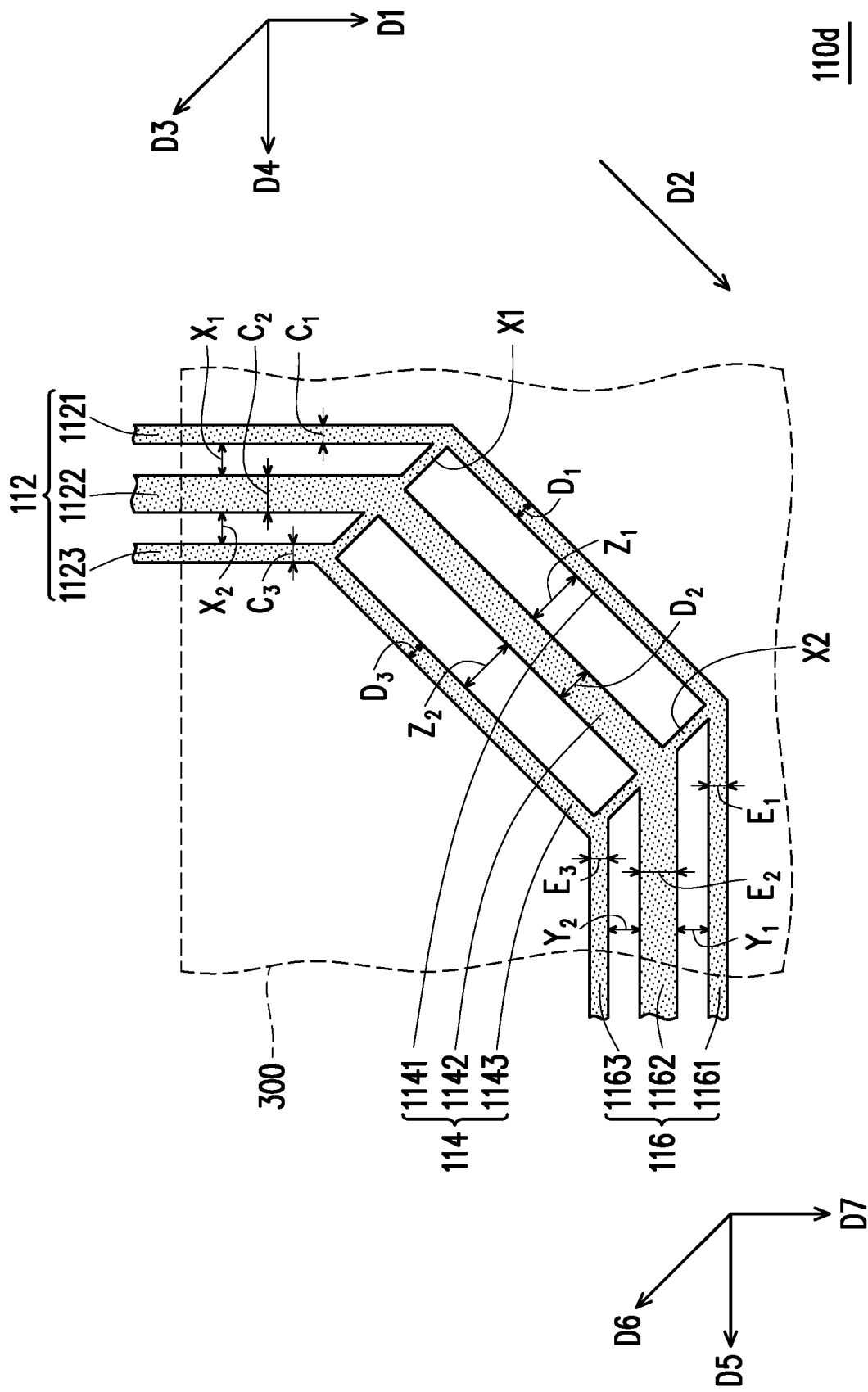
FIG. 2D is a schematic top view of a trace according to an embodiment of the present invention.

FIG. 2D is a schematic top view of a trace according to the present invention. For example, FIG. 2D is a schematic top view of one of the traces in the region A of FIG. 1. A trace 110d of FIG. 2D is similar to the trace 110c of FIG. 2C. The same or similar contents are omitted herein. The trace 110d of FIG. 2D and the trace 110c of FIG. 2C may be different traces in the same display panel, or may be traces in different display panels.

The main difference between the trace 110d of FIG. 2D and the trace 110c of FIG. 2C is that n is equal to 3 in the trace 110d. In other words, the signal line 112 includes the first signal line 1121 to the third signal line 1123.

In the present embodiment, the line width $C_1$ and the line width $C_3$ are each 1 82 m, and the line width $C_2$ is 3 μm. In the present embodiment, the spacing $X_1$ and the spacing $X_2$ are 2.5 μm.

In the present embodiment, the line width $D_1$ and the line width $D_3$ are 1.5 μm, and the line width $D_2$ is 3 μm. In the present embodiment, the line width $E_1$ and the line width $E_3$ are 1 μm, and the line width $E_2$ is 3 μm.

The trace 110d of the present embodiment satisfies the foregoing Formula 3, which can improve the problem of trace burning.

Figure 2E:
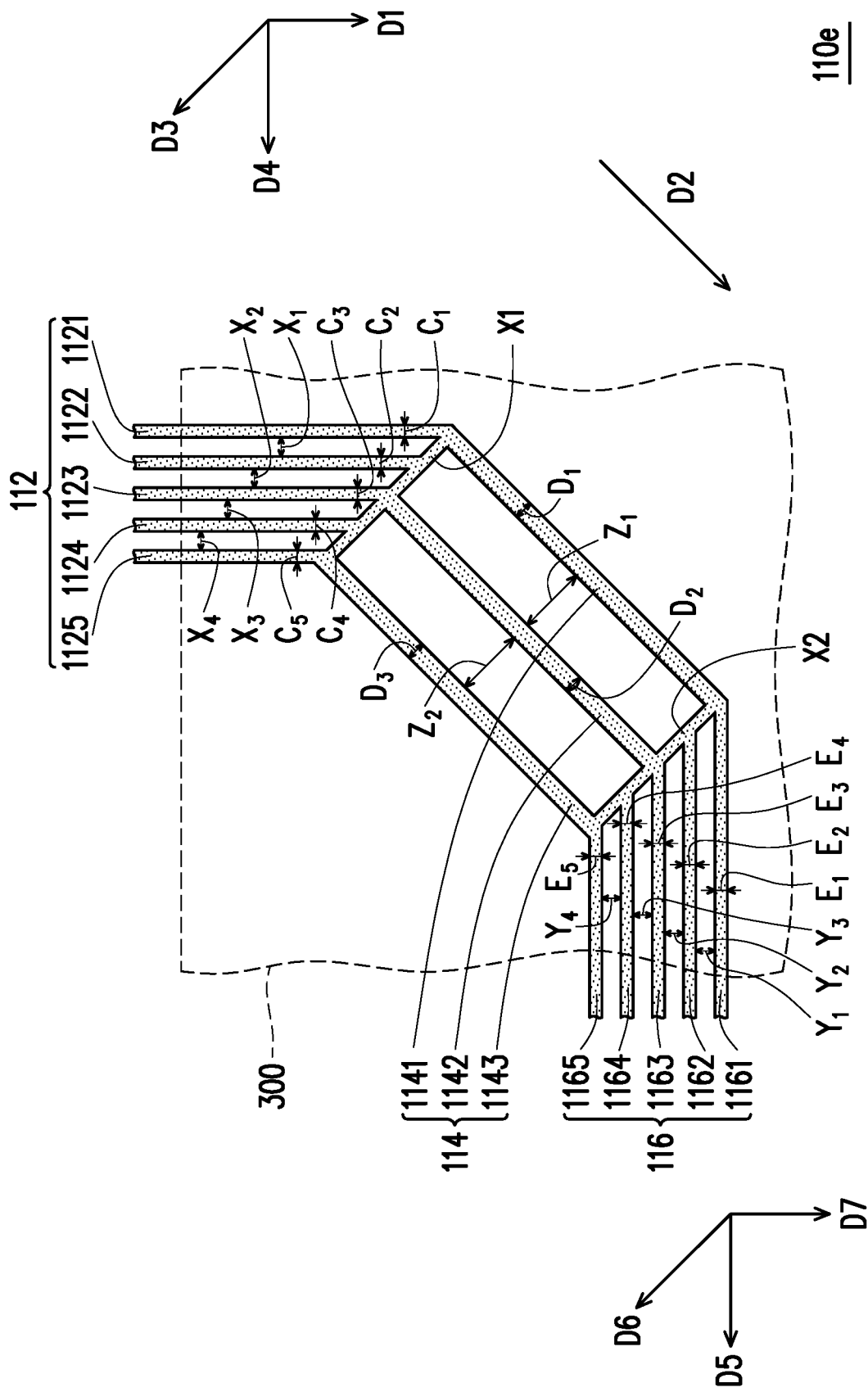
FIG. 2E is a schematic top view of a trace according to an embodiment of the present invention.

FIG. 2E is a schematic top view of a trace according to the present invention. For example, FIG. 2E is a schematic top view of one of the traces in the region A of FIG. 1. A trace 110e of FIG. 2E is similar to the trace 110b of FIG. 2B. The same or similar contents are omitted herein. The trace 110e of FIG. 2E and the trace 110b of FIG. 2B may be different traces in the same display panel, or may be traces in different display panels.

The main difference between the trace 110e of FIG. 2E and the trace 110b of FIG. 2B is that k is equal to 5 in the trace 110e. In other words, the guide line 116 includes the first guide line 1161 to the fifth guide line 1165.

In the present embodiment, the line widths $E_1$ to $E_5$ are each 1 μm. In the present embodiment, the spacing $Y_1$ to the spacing $Y_5$ are each 2 μm.

Figure 2F:
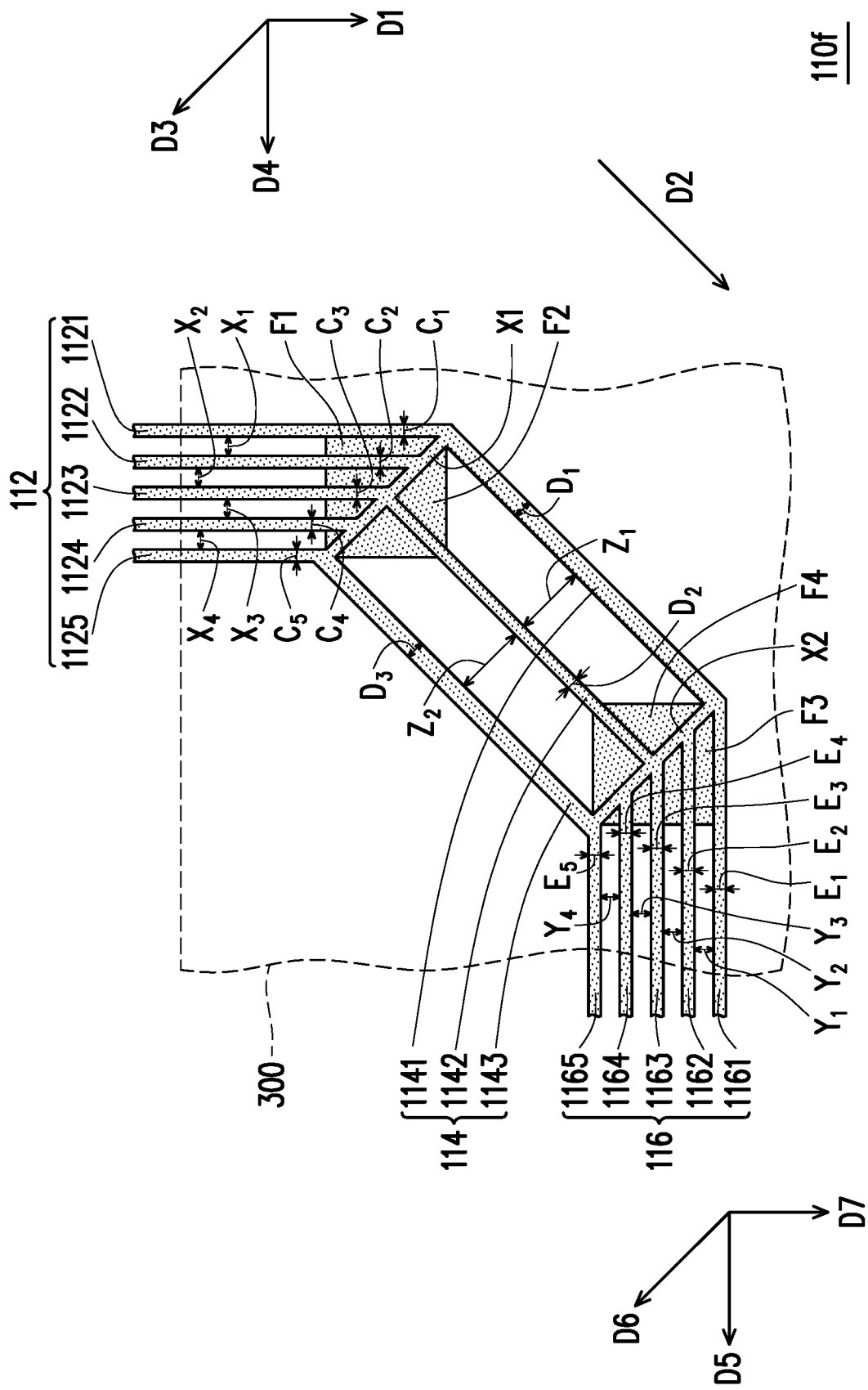
FIG. 2F is a schematic top view of a trace according to an embodiment of the present invention.

FIG. 2F is a schematic top view of a trace according to the present invention. For example, FIG. 2F is a schematic top view of one of the traces in the region A of FIG. 1. A trace 110f of FIG. 2F is similar to the trace 110e of FIG. 2E. The same or similar contents are omitted herein. The trace 110f of FIG. 2F and the trace 110e of FIG. 2E may be different traces in the same display panel, or may be traces in different display panels.

The main difference between the trace 110f of FIG. 2F and the trace 110e of FIG. 2E is that the trace 110f further includes the first auxiliary electrode F1, the second auxiliary electrode F2, the third auxiliary electrode F3, and the fourth auxiliary electrode F4. The arrangement manner of the first auxiliary electrode F1, the second auxiliary electrode F2, the third auxiliary electrode F3, and the fourth auxiliary electrode F4 may be seen in the embodiment of FIG. 2A, and the descriptions thereof are omitted herein.

Based on the above, the trace 110f of the present embodiment improves the problem of trace burning by adjusting a line width and a line spacing, and providing an auxiliary electrode.

In the present embodiment, the line widths $E_1$ to $E_5$ are each 1 μm. In the present embodiment, the spacing $Y_1$ to the spacing $Y_4$ are each 2 μm.

Figure 2G:
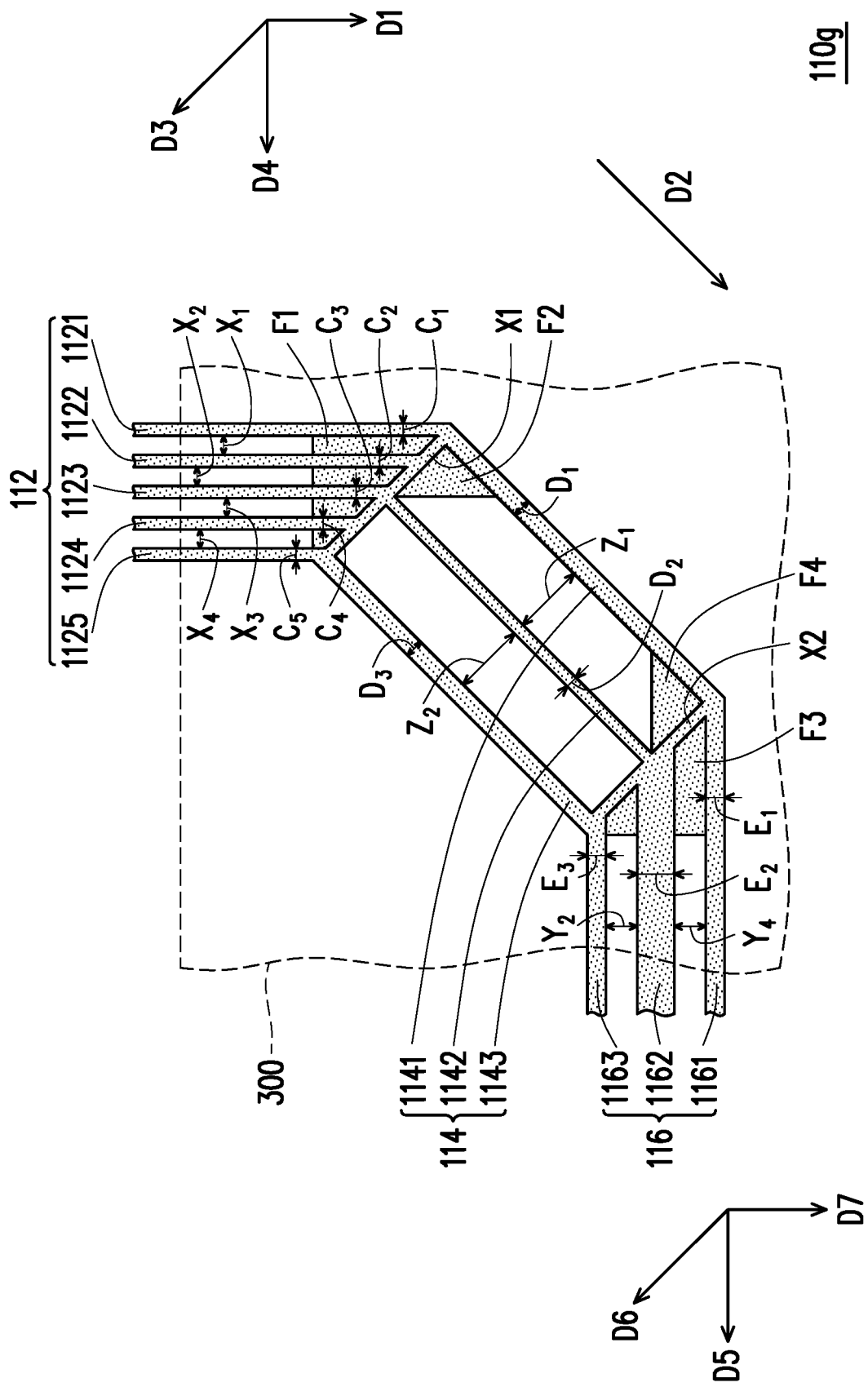
FIG. 2G is a schematic top view of a trace according to an embodiment of the present invention.

FIG. 2G is a schematic top view of a trace according to the present invention. For example, FIG. 2G is a schematic top view of one of the traces in the region A of FIG. 1. A trace 110g of FIG. 2G is similar to the trace 110f of FIG. 2F. The same or similar contents are omitted herein. The trace 110g of FIG. 2G and the trace 110f of FIG. 2F may be different traces in the same display panel, or may be traces in different display panels.

The main difference between the trace 110g of FIG. 2G and the trace 110f of FIG. 2F is that the second auxiliary electrode F2 and the fourth auxiliary electrode F4 of the trace 110g are located between the first turning line 1141 and the second turning line 1142. In addition, in the guide line 116 of the trace 110g, k is equal to 3. The guide line 116 includes the first guide line 1161, the second guide line 1162, and the third guide line 1163.

Figure 2H:
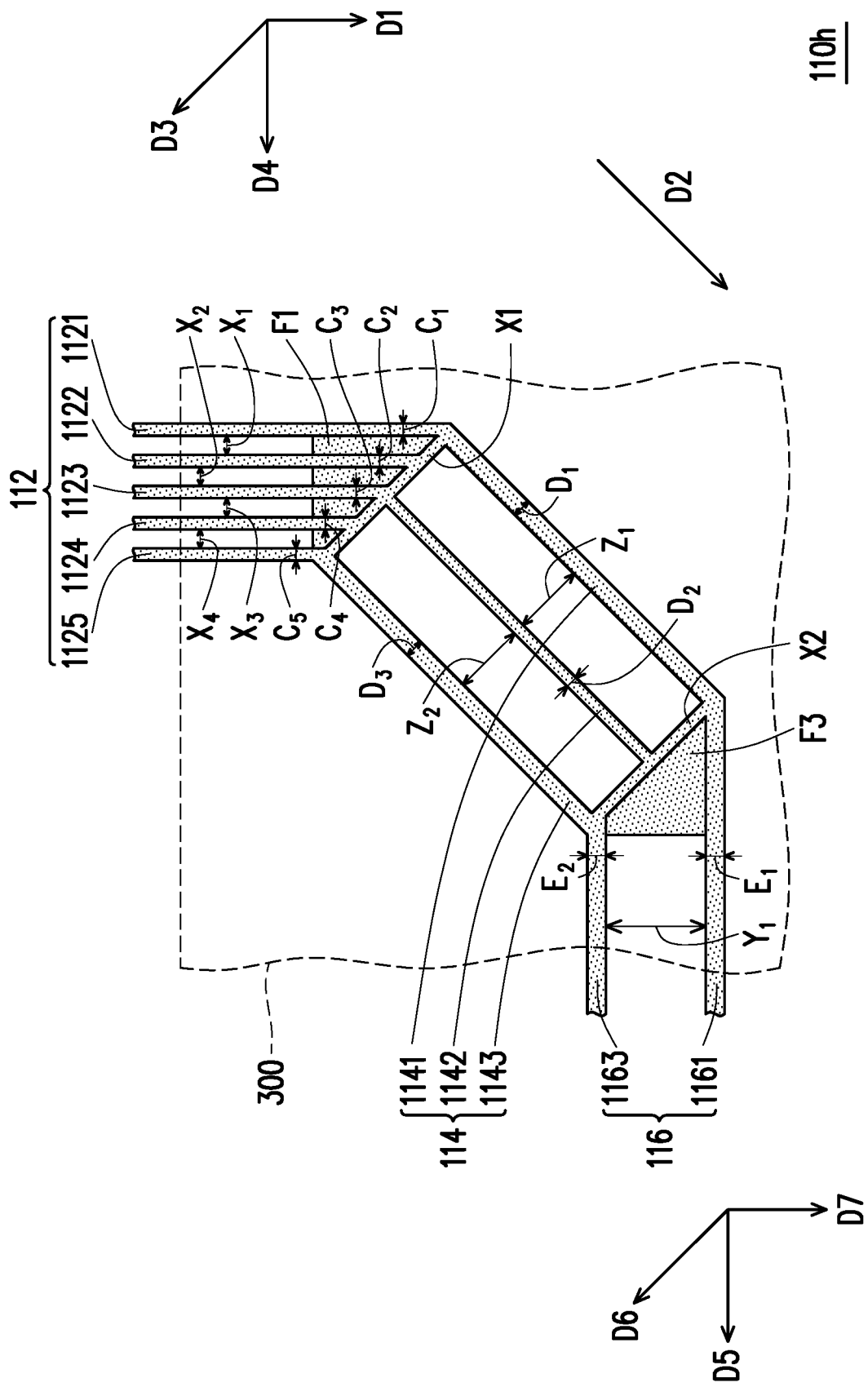
FIG. 2H is a schematic top view of a trace according to an embodiment of the present invention.

FIG. 2H is a schematic top view of a trace according to the present invention. For example, FIG. 2H is a schematic top view of one of the traces in the region A of FIG. 1. A trace 110h of FIG. 2H is similar to the trace 110b of FIG. 2B. The same or similar contents are omitted herein. The trace 110h of FIG. 2H and the trace 110b of FIG. 2B may be different traces in the same display panel, or may be traces in different display panels.

The main difference between the trace 110h of FIG. 2H and the trace 110b of FIG. 2B is that the trace 110h includes the first auxiliary electrode F1 and the third auxiliary electrode F3. The arrangement manner of the first auxiliary electrode F1 and the third auxiliary electrode F3 may be seen in the embodiment of FIG. 2A, and the descriptions thereof are omitted herein.

Figure 2I:
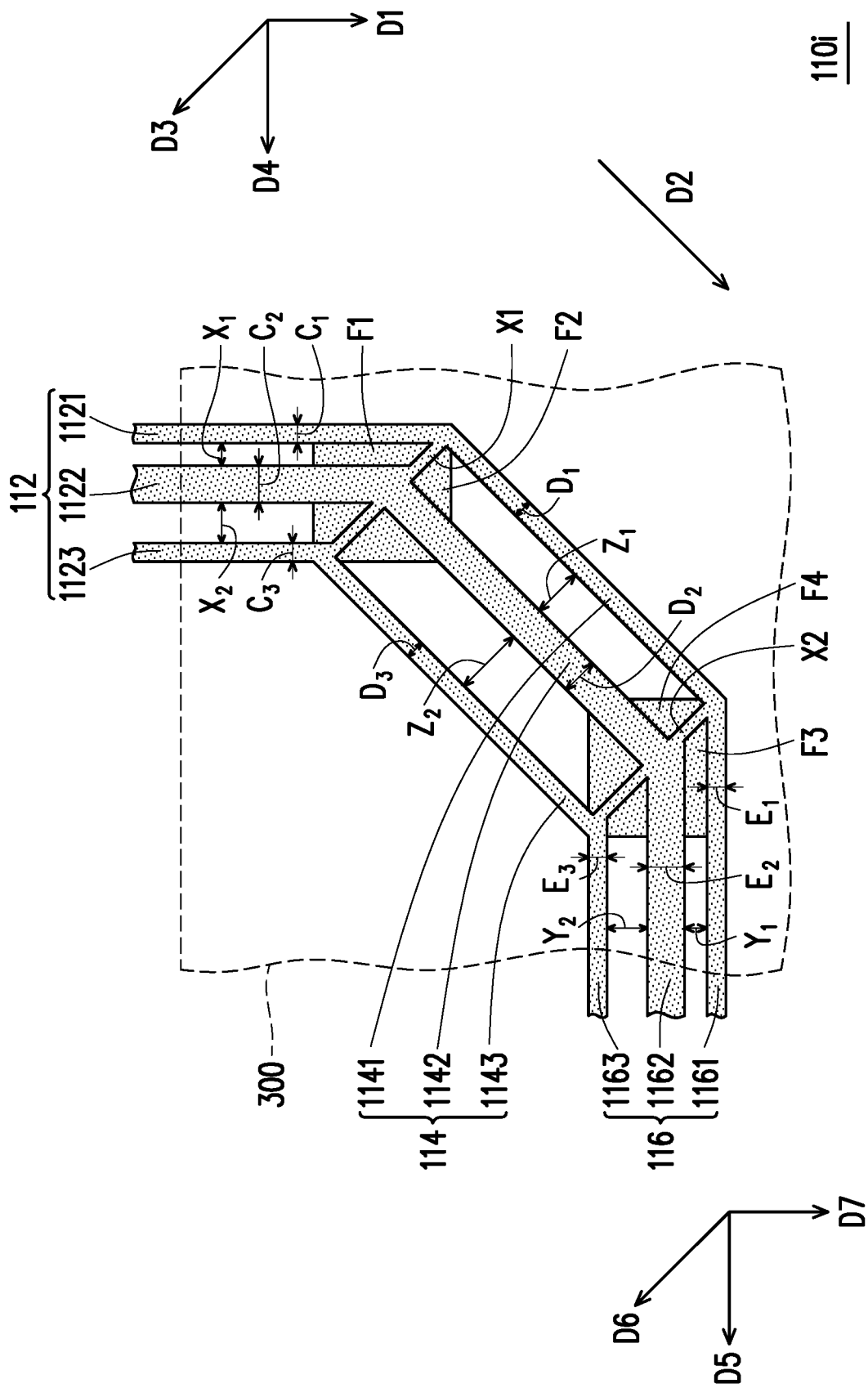
FIG. 2I is a schematic top view of a trace according to an embodiment of the present invention.

FIG. 2I is a schematic top view of a trace according to the present invention. For example, FIG. 2I is a schematic top view of one of the traces in the region A of FIG. 1. A trace 110i of FIG. 2I is similar to the trace 110d of FIG. 2D. The same or similar contents are omitted herein. The trace 110i of FIG. 2I and the trace 110d of FIG. 2D may be different traces in the same display panel, or may be traces in different display panels.

The main difference between the trace 110i of FIG. 2I and the trace 110d of FIG. 2D is that the trace 110i includes the first auxiliary electrode F1, the second auxiliary electrode F2, the third auxiliary electrode F3, and the fourth auxiliary electrode F4. The arrangement manner of the first auxiliary electrode F1, the second auxiliary electrode F2, the third auxiliary electrode F3, and the fourth auxiliary electrode F4 is similar to that in the embodiment of FIG. 2A, and the descriptions thereof are omitted herein.

In the present embodiment, the spacing $X_1$ between the first signal line 1121 and the second signal line 1122 is different from the spacing $X_2$ between the second signal line 1122 and the third signal line 1123. The spacing $Z_1$ between the first turning line 1141 and the second turning line 1142 is different from the spacing $Z_2$ between the second turning line 1142 and the third turning line 1143. The spacing $Y_1$ between the first guide line 1161 and the second guide line 1162 is different from the spacing $Y_2$ between the second guide line 1162 and the third guide line 1163.

Figure 2J:
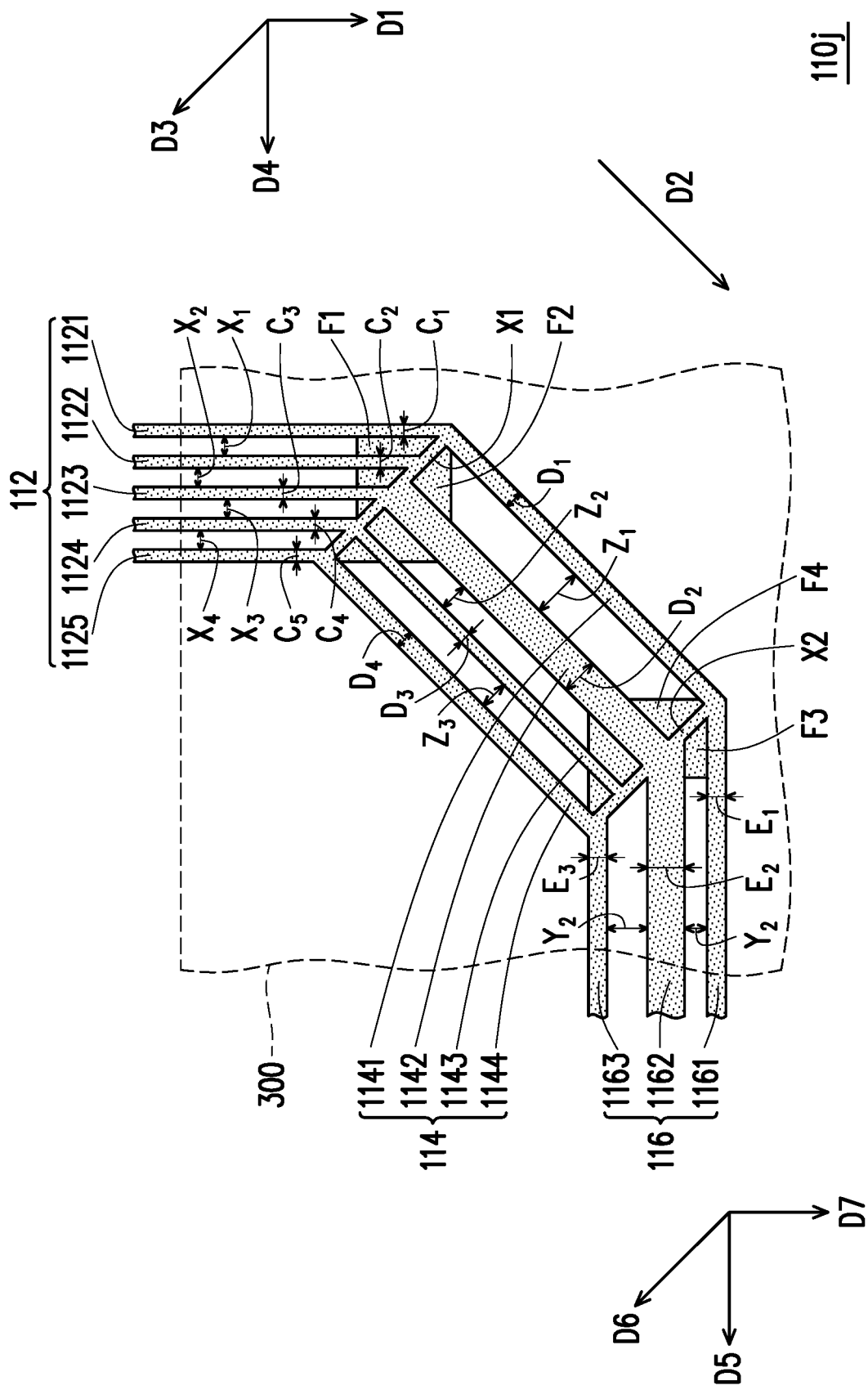
FIG. 2J is a schematic top view of a trace according to an embodiment of the present invention.

FIG. 2J is a schematic top view of a trace according to the present invention. For example, FIG. 2J is a schematic top view of one of the traces in the region A of FIG. 1. A trace 110*j* of FIG. 2J is similar to the trace 110*i* of FIG. 2I. The same or similar contents are omitted herein. The trace 110*j* of FIG. 2J and the trace 110*i* of FIG. 2I may be different traces in the same display panel, or may be traces in different display panels.

The main difference between the trace 110*j* of FIG. 2J and the trace 110*i* of FIG. 2I is that the first auxiliary electrode F1 of the trace 110*j* is located between the first signal line 1121 and the fourth signal line 1124, and the third auxiliary electrode F3 is located between the first signal line 1161 and the second guide line 1162.

In the trace 110*j*, m is equal to 4. In other words, the turning line 114 includes the first turning line 1141 to the fourth turning line 1144.

Figure 2K:
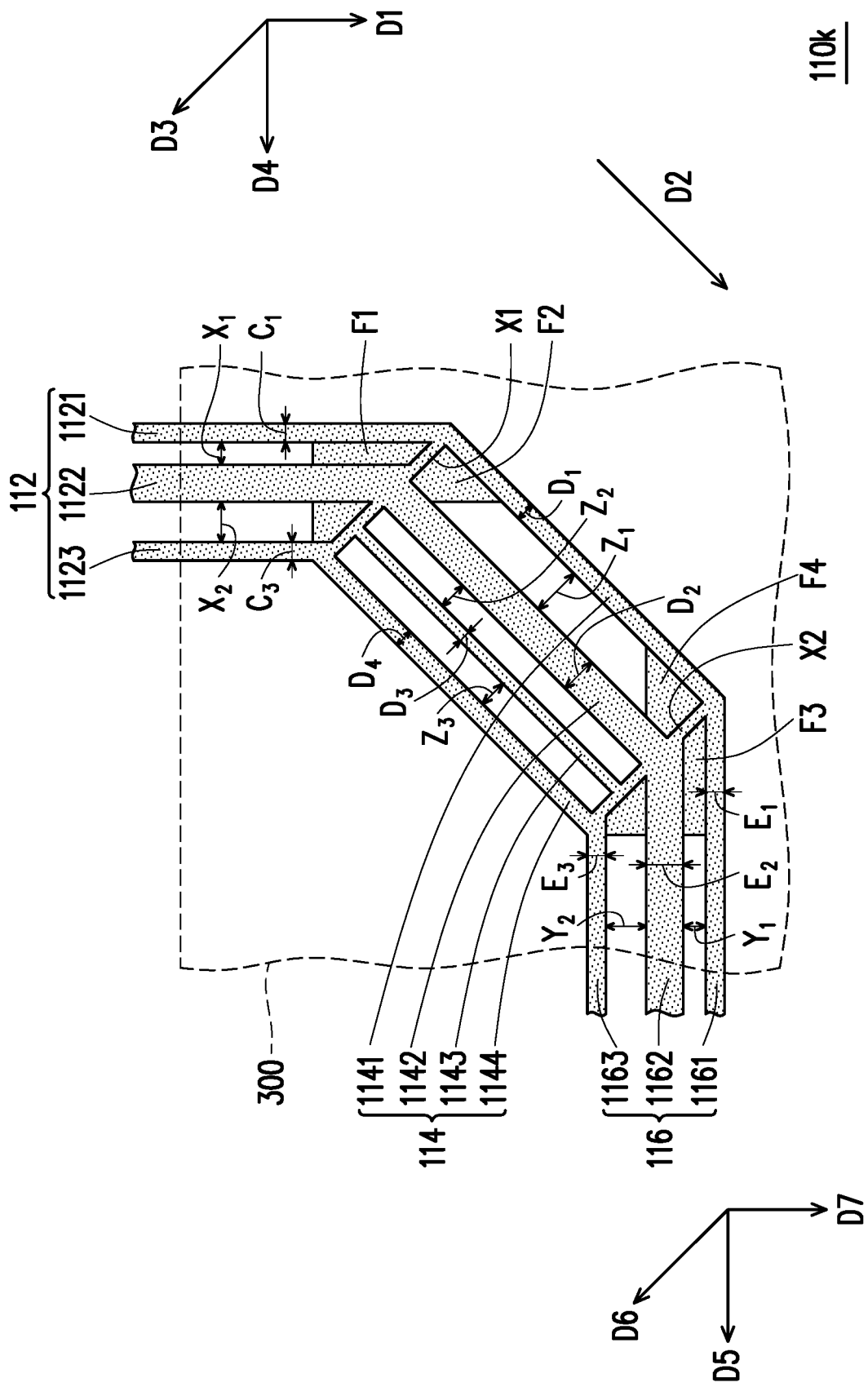
FIG. 2K is a schematic top view of a trace according to an embodiment of the present invention.

FIG. 2K is a schematic top view of a trace according to the present invention. For example, FIG. 2K is a schematic top view of one of the traces in the region A of FIG. 1A. A trace 110*k* of FIG. 2K is similar to the trace 110*j* of FIG. 2J. The same or similar contents are omitted herein. The trace 110*k* of FIG. 2K and the trace 110*j* of FIG. 2J may be different traces in the same display panel, or may be traces in different display panels.

The main difference between the trace 110*k* of FIG. 2K and the trace 110*j* of FIG. 2J is that n is equal to 3 in the trace 110*k*. In other words, the signal line 114 includes the first signal line 1121 to the third signal line 1123.

The first auxiliary electrode F1 of the trace 110*k* is located between the first signal line 1121 and the third signal line 1123, and the third auxiliary electrode F3 is located between the first signal line 1161 and the third guide line 1163.

The second auxiliary electrode F2 and the fourth auxiliary electrode F4 of the trace 110*k* are located between the first turning line 1141 and the second turning line 1142.

Figure 3:
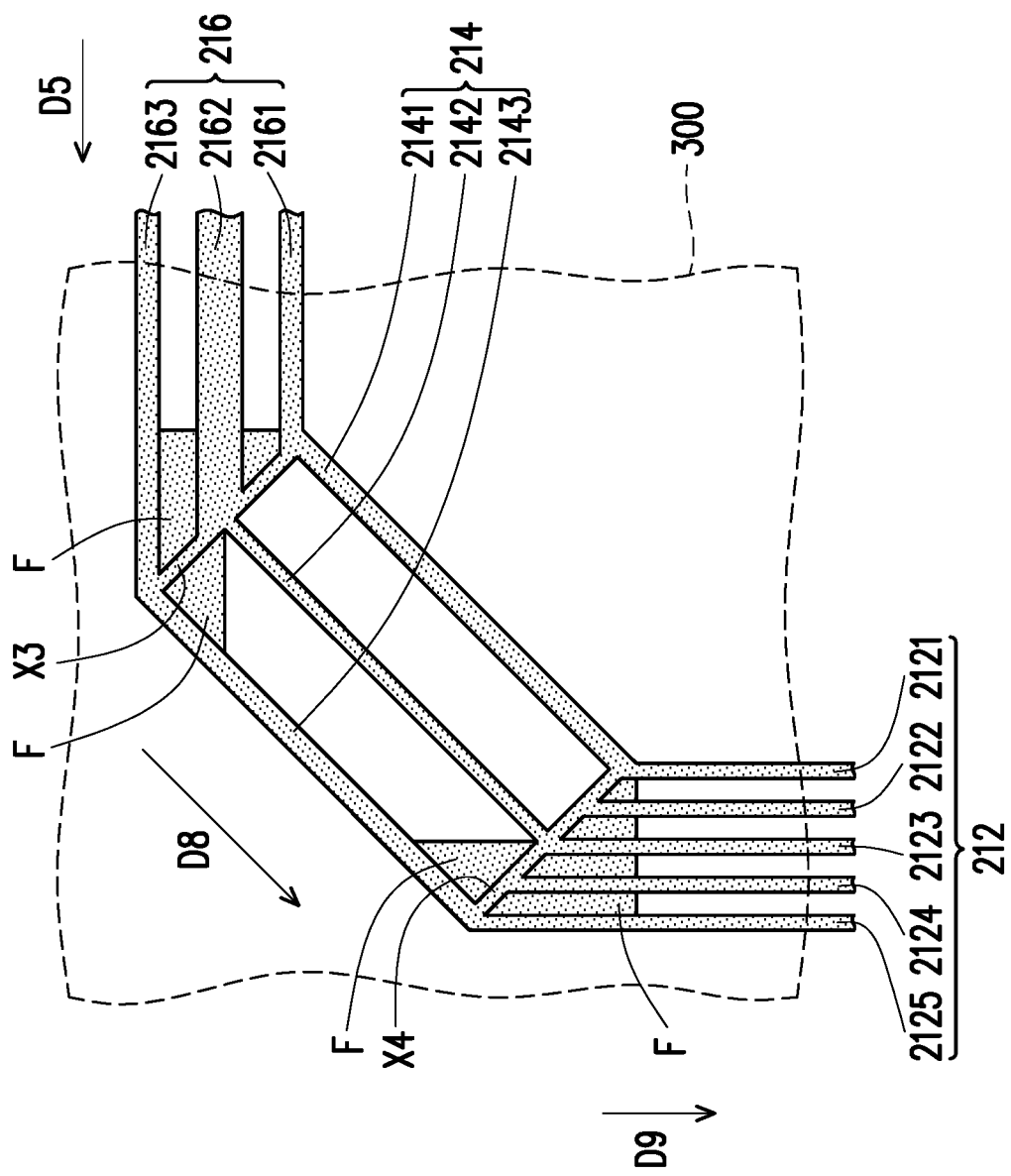
FIG. 3 is a schematic top view of one of traces in a region B of FIG. 1.

FIG. 3 is a schematic top view of one of traces in the region B of FIG. 1.

Referring to FIG. 3, a trace 210 includes a guide line 216, a connection line 214 and a transmission line 212 connected in sequence.

The guide line 216 includes a first guide line 2161 to a kth guide line substantially extending along the fifth direction D5, k being greater than or equal to 2. In the present embodiment, k is equal to 5. The guide line 216 includes the first guide line 2161 to a fifth guide line 2165.

The connection line 214 includes a first connection line 2141 to a pth connection line substantially extending along a direction D8, p being a positive integer and p being greater than or equal to 2. In the present embodiment, p is equal to 3. The connection line 214 includes the first connection line 2141 to a third connection line 2143. The connection line 214 is connected to the guide line 216. A common boundary X3 is provided between the connection line 214 and the guide line 216.

The transmission line 212 includes a first transmission line 2121 to a qth transmission line substantially extending along a direction D9, q being a positive integer and q being greater than or equal to 2. In the present embodiment, q is equal to 3. The transmission line 212 includes the first transmission line 2121 to a third transmission line 2123. The transmission line 212 is connected to the connection line 214. A common boundary X4 is provided between the connection line 214 and the transmission line 212. The connection line 214 is located between the transmission line 212 and the guide line 216.

In the present embodiment, a length of the connection line 214 is less than a length of the transmission line 212 and a length of the guide line 216. The common boundary X3 is close to the common boundary X4. Therefore, when a current is supplied, energy is easily concentrated at a portion of the connection line 214.

Referring to FIG. 3 and FIG. 2J, in the present embodiment, the trace 210 is connected to a trace 210*a*, and the guide line 216 of the trace 210 is substantially equal to the guide line 116 of the trace 110. In other words, the first guide line 2161 to the third guide line 2163 of FIG. 3 are substantially equal to the first guide line 1161 to the third guide line 1163 of FIG. 2J. In other embodiments, other electronic components or other traces may be included between the guide line 216 and the guide line 116.

In the present embodiment, the problem of burning of the connection line 214 may be alleviated by a similar method to that in any of the foregoing embodiments for improving the turning line 114. For example, the problem of burning of the connection line 214 can be alleviated by adjusting the line widths of the first transmission line 2121 to the qth transmission line, adjusting the spacing between the first transmission line 2121 to the qth transmission line, adding an auxiliary electrode F at the common boundary between the connection line 214 and the guide line 216, and adding the auxiliary electrode F at the common boundary between the connection line 214 and the transmission line 212.

Figure 4:
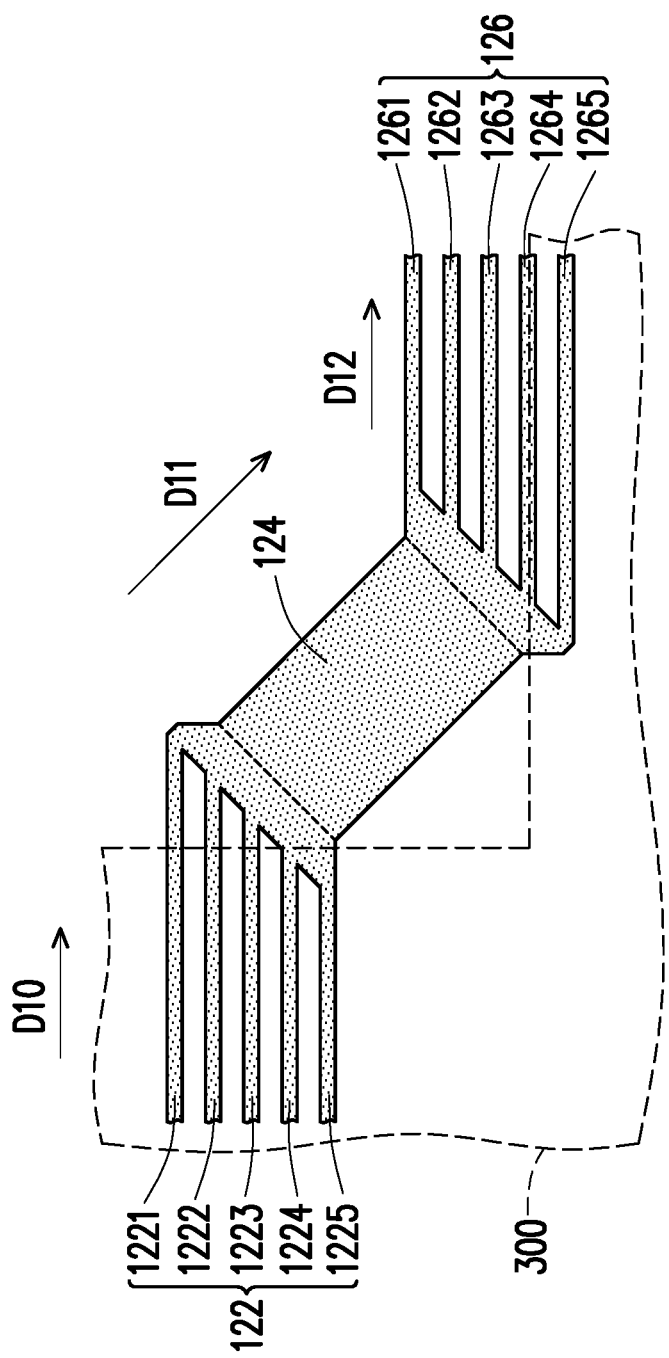
FIG. 4 is a schematic top view of one of traces in a region C of FIG. 1.

FIG. 4 is a schematic top view of one of traces in the region C of FIG. 1.

Referring to FIG. 4, a trace 120 includes a guide line 122, a connection line 124 and a transmission line 126 connected in sequence.

The guide line 122 includes a first guide line 1221 to an rth guide line substantially extending along a direction D10, r being a positive integer and being greater than or equal to 2. In the present embodiment, r is equal to 5. The guide line 1221 includes the first guide line 1221 to a fifth guide line 1225.

The connection line 124 extends along a direction D11. The connection line 124 is connected to the guide line 122. In the present embodiment, the connection line 124 is electrically connected to the guide line 116 of FIG. 2A. In other words, there may be other electronic components or other traces between the connection line 124 and the guide line 116.

The connection line 124 does not overlap the sealant 300. Therefore, even if the connection line 124 is of a solid structure, the sealant 300 can be cured smoothly.

The transmission line 126 includes a first transmission line 1261 to a qth transmission line substantially extending along a direction D12, q being greater than or equal to 2. In the present embodiment, q is equal to 5. The transmission line 126 includes the first transmission line 1261 to a fifth transmission line 1265. The transmission line 126 is connected to the connection line 124. The connection line 124 is located between the transmission line 126 and the guide line 122.

Figure 5A:
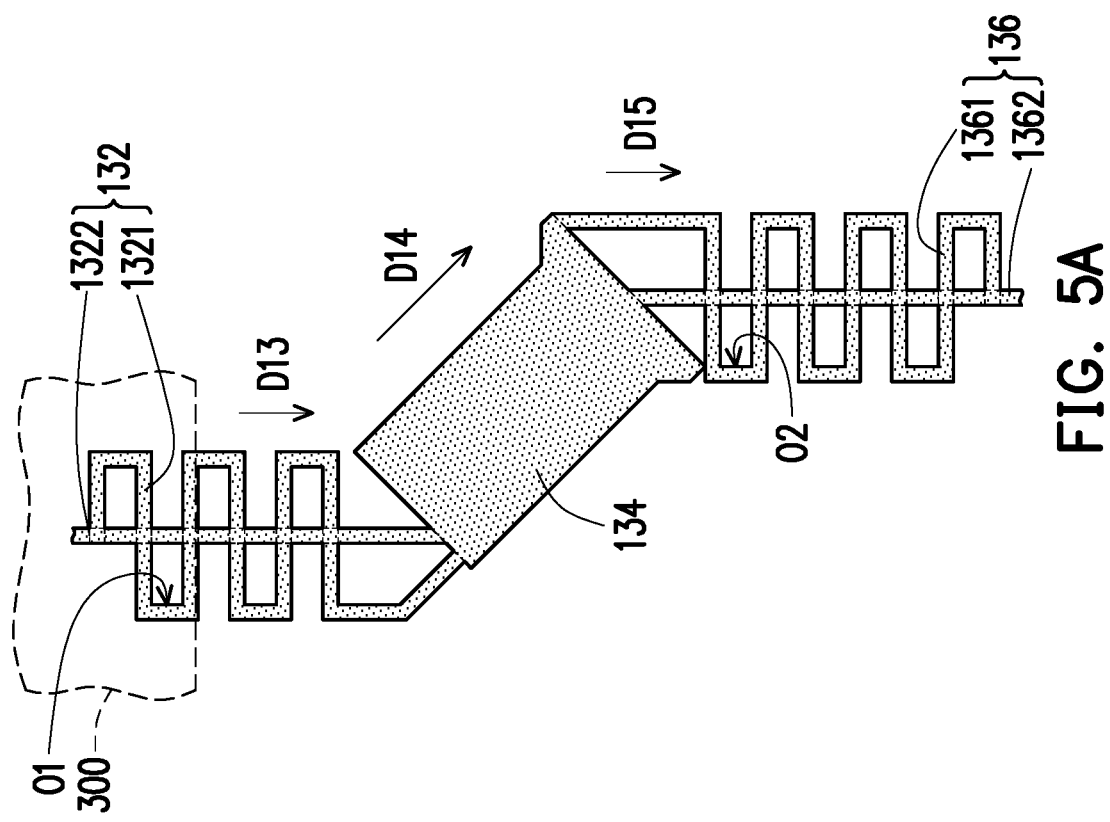
FIG. 5A is a schematic top view of one of traces in a region D of FIG. 1.

FIG. 5A is a schematic top view of one of traces in the region D of FIG. 1.

Referring to FIG. 5A and FIG. 1, a trace 130*a* includes an output line 132, a fan-out line 134 and an input line 136. The fan-out line 134 is located between the output line 132 and the input line 136.

The output line 132 extends along a direction D13. The output line 132 is electrically connected to the driving control unit 400. The output line 132 overlaps the sealant 300. The output line 132 includes a circuitous (wavy) first output line 1321 and/or a linear second output line 1322. Although the first output line 1321 is integrated with the second output line 1322 in the present embodiment, the present invention is not limited thereto. In other embodiments, the first output line 1321 and the second output line 1322 may be respectively located in different conductive layers.

The first output line 1321 and the second output line 1322 overlap, and a plurality of openings O1 are provided between a projection of the first output line 1321 and a projection of the second output line 1322 in a direction perpendicular to the first substrate, so that the sealant 300 can be smoothly cured.

The fan-out line 134 extends along a direction D14. The fan-out line 134 is connected to the output line 132. The fan-out line 134 does not overlap the sealant 300. Therefore, even if the fan-out line 134 is of a solid structure, the sealant 300 can be cured smoothly.

The input line 136 extends along a direction D15. The input line 136 is electrically connected to a pixel array (not shown) in the display area AA. The input line 136 includes a wavy first input line 1361 and/or a linear second input line 1362. Although the first input line 1361 is integrated with the second input line 1362 in the present embodiment, the present invention is not limited thereto. In other embodiments, the first input line 1321 and the second input line 1362 may be respectively located in different conductive layers.

The first input line 1321 and the second input line 1362 overlap, and a plurality of openings O2 are provided between the first input line 1321 and the second input line 1362.

In the present embodiment, a problem of nonuniform distribution of impedance throughout the display panel is alleviated by adjusting shapes of the first output line 1321 and the first input line 1361.

Figure 5B:
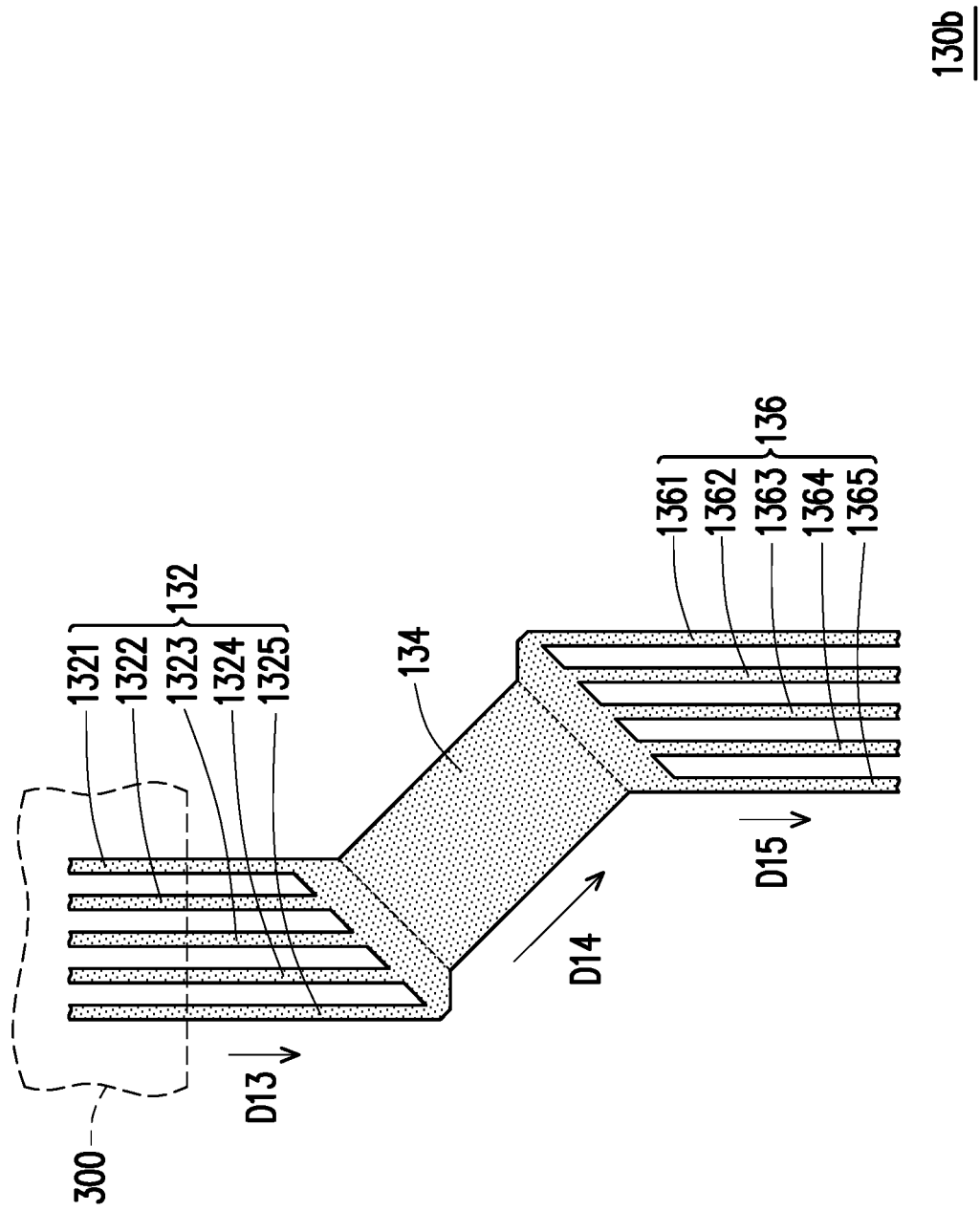
FIG. 5B is a schematic top view of a trace according to an embodiment of the present invention.

FIG. 5B is a schematic top view of one of the traces in the region D of FIG. 1A. A trace 130*b* of FIG. 5B is similar to the trace 130*a* of FIG. 5A. The same or similar contents are omitted herein. The trace 130*b* of FIG. 5B and the trace 130*a* of FIG. 5A may be different traces in the same display panel, or may be traces in different display panels.

The main difference between the trace 130*b* of FIG. 5B and the trace 130*a* of FIG. 5A is that the output line 132 of the trace 130*b* includes the first output line 1321 to a fifth output line 1325 parallel with each other, and the input line 136 includes the first input line 1361 to a fifth input line 1365 parallel with each other.

Figure 5C:
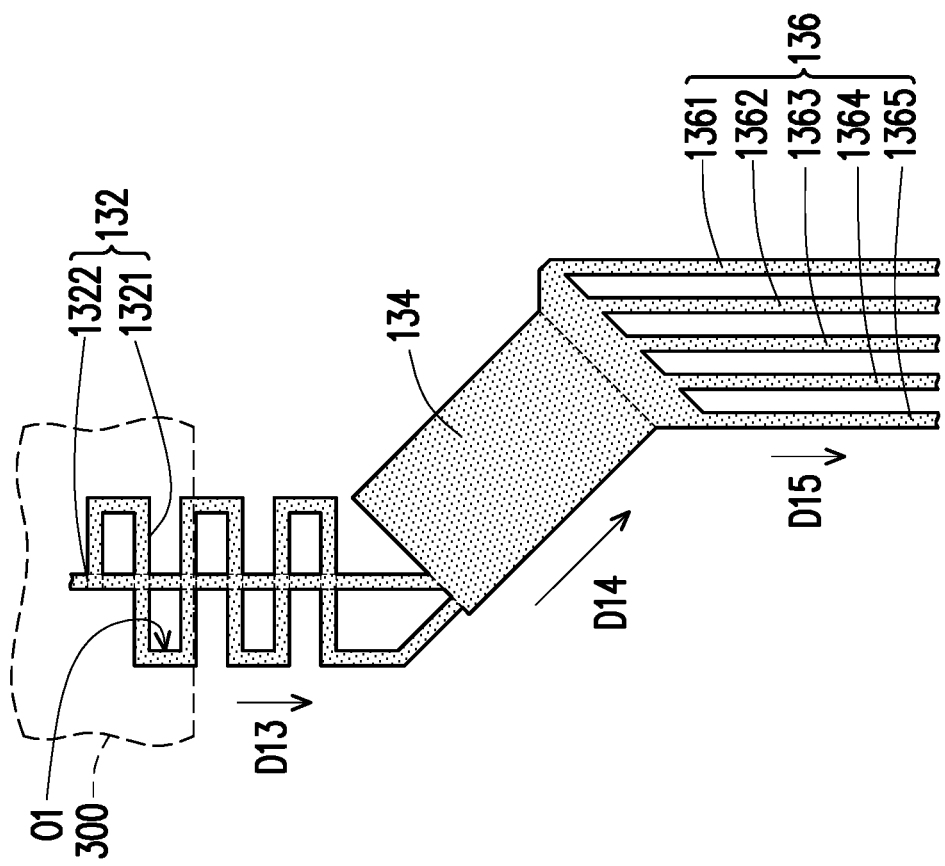
FIG. 5C is a schematic top view of a trace according to an embodiment of the present invention.

FIG. 5C is a schematic top view of one of the traces in the region D of FIG. 1A. A trace 130*c* of FIG. 5C is similar to the trace 130*a* of FIG. 5A. The same or similar contents are omitted herein. The trace 130*c* of FIG. 5C and the trace 130*a* of FIG. 5A may be different traces in the same display panel, or may be traces in different display panels.

The main difference between the trace 130*c* of FIG. 5C and the trace 130*a* of FIG. 5A is that the input line 136 of the trace 130*c* includes the first input line 1361 to the fifth input line 1365 parallel with each other.

In summary, by adjusting line widths of various electric wires (e.g., a first turning line to an mth turning line and/or a first connection line to a pth connection line) in a trace, adjusting a line spacing between various electric wires in the trace, and/or providing an auxiliary electrode at a turning portion of the trace, the problem that the trace is likely to be burned at the turning portion can be effectively alleviated.

Although the present invention is described with reference to the above embodiments, the embodiments are not intended to limit the present invention. A person of ordinary skill in the art may make variations and modifications without departing from the spirit and scope of the present invention. Therefore, the protection scope of the present invention should be subject to the appended claims.

What is claimed is:

1. A display panel, comprising:
a first substrate;
a second substrate, provided opposite to the first substrate;
a sealant, located between the first substrate and the second substrate;
a signal line, located on the first substrate, and comprising a first signal line to an nth signal line substantially extending along a first direction, n being a positive integer and n being greater than or equal to 2; and
a turning line, connected to the signal line, the turning line comprising a first turning line to an mth turning line substantially extending along a second direction, m being a positive integer and m being greater than or equal to 2, a common boundary between the turning line and the signal line being substantially parallel with a third direction, and the signal line overlapping the turning line and the sealant in a direction perpendicular to the first substrate, wherein a first auxiliary region is defined by the first direction, a fourth direction perpendicular to the first direction, and the third direction, one side of the first auxiliary region overlaps the common boundary, two vertices of the first auxiliary region overlap the first signal line and the other vertex of the first auxiliary region overlaps the nth signal line, the signal line comprises a first auxiliary electrode provided between the first and nth signal lines and the common boundary in the first auxiliary region, the first auxiliary electrode is connected to at least one of the first signal line to the nth signal line, a vertical projection area of the signal line in the first auxiliary region is A1, an area of the first auxiliary region is B1, and 60%≤A1/B1≤100%.

2. The display panel according to claim 1, wherein a vertical projection area of the first auxiliary electrode in the first auxiliary region is C1, and 5%≤C1/B1≤50%.

3. The display panel according to claim 1, wherein a second auxiliary region is defined by the first direction, the second direction, and the third direction, one side of the second auxiliary region overlaps the common boundary, two vertices of the second auxiliary region overlap the first turning line and the other vertex of the second auxiliary region overlaps the mth turning line, the turning line comprises a second auxiliary electrode provided between the first and mth turning lines and the common boundary in the second auxiliary region, the second auxiliary electrode is connected to at least one of the first turning line to the mth turning line, a vertical projection area of the turning line in the second auxiliary region is A2, an area of the second auxiliary region is B2, and 60%≤A2/B2≤100%.

4. The display panel according to claim 3, wherein a vertical projection area of the second auxiliary electrode in the second auxiliary region is C2, and 5%≤C2/B2≤50%.

5. The display panel according to claim 1, further comprising:
a driving control unit, located on the first substrate, wherein the signal line is closer to the driving control unit than the turning line, and a total line width of the first signal line to the nth signal line is greater than a total line width of the first turning line to the mth turning line.

6. The display panel according to claim 1, further comprising:
a guide line, comprising a first guide line to a kth guide line substantially extending along a fifth direction, k being a positive integer and k being greater than or equal to 2, wherein the guide line is connected to the turning line, and the turning line is located between the guide line and the signal line.

7. The display panel according to claim 6, further comprising:
a connection line, comprising a first connection line to a pth connection line substantially extending along a sixth direction, p being a positive integer and p being greater than or equal to 2, and the connection line being connected to the guide line; and
a transmission line, comprising a first transmission line to a qth transmission line substantially extending along a seventh direction, q being a positive integer and q being greater than or equal to 2, and the transmission line being connected to the connection line, the connection line being located between the transmission line and the guide line.

8. The display panel according to claim 6, further comprising:
a connection line, extending along a sixth direction, the connection line being electrically connected to the guide line, the connection line not overlapping the sealant, and the connection line being of a solid structure; and
a transmission line, comprising a first transmission line to a qth transmission line substantially extending along a seventh direction, q being a positive integer and q being greater than or equal to 2, and the transmission line being connected to the connection line.

9. The display panel according to claim 1, further comprising:
a driving control unit, located on the first substrate; and
an output line, extending along an eighth direction, the output line being electrically connected to the driving control unit and overlapping the sealant, and the output line comprising a wavy first output line.

10. The display panel according to claim 9, further comprising a fan-out line extending along a ninth direction, wherein the fan-out line is connected to the output line, the fan-out line does not overlap the sealant, and the fan-out line is of a solid structure.

11. The display panel according to claim 9, further comprising a linear second output line, the first output line overlapping the second output line, and a plurality of openings being provided between the first output line and the second output line.

12. The display panel according to claim 1, wherein m is greater than or equal to 3, the second turning line is located between the first turning line and the mth turning line, and a line width of the second turning line is greater than a line width of the first turning line and a line width of the mth turning line.

13. The display panel according to claim 1, wherein line widths of the first signal line to the nth signal line are $C_1$ to $C_n$, respectively, spacing between an ath signal line and an (a+1)th signal line is $X_a$, a is an integer of 1 to (n−1), line widths of the first turning line to the mth turning line are $D_1$ to $D_m$, respectively, spacing between a bth turning line and a (b+1)th turning line is $Z_b$, b is an integer of 1 to (m−1), wherein the display panel satisfies at least one of $$\sum_{w=1}^{m} Dw > \sum_{w=1}^{n} Cw$$

and $Z_b > X_a$, and $$\frac{X_{n-1}}{C_n + X_{n-1}} \geq 30\%.$$

14. A display panel, comprising:
a first substrate;
a second substrate, provided opposite to the first substrate;
a sealant, located between the first substrate and the second substrate;
a signal line, located on the first substrate, and comprising a first signal line to an nth signal line substantially extending along a first direction, n being a positive integer and n being greater than or equal to 2, and the signal line overlapping the turning line and the sealant in a direction perpendicular to the first substrate, wherein line widths of the first signal line to the nth signal line are $C_1$ to $C_n$, respectively, spacing between an ath signal line and an (a+1)th signal line is $X_a$, and a is an integer of 1 to (n−1); and
a turning line, connected to the signal line, the turning line comprising a first turning line to an mth turning line substantially extending along a second direction, m being a positive integer and m being greater than or equal to 2, wherein line widths of the first turning line to the mth turning line are $D_1$ to $D_m$, respectively, spacing between a bth turning line and a (b+1)th turning line is $Z_b$, and b is an integer of 1 to (m−1), wherein
the display panel satisfies at least one of $$\sum_{w=1}^{m} Dw > \sum_{w=1}^{n} Cw$$

and $Z_b > X_a$, and $$\frac{X_{n-1}}{C_n + X_{n-1}} \geq 30\%.$$

15. The display panel according to claim 14, wherein $$\frac{Z_{m-1}}{D_m + Z_{m-1}} \geq 30\%.$$

16. The display panel according to claim 14, wherein $$0.7 \leq \frac{\sum_{w=1}^{n} Cw}{\sum_{w=1}^{m} Dw} \leq 1.3.$$

17. The display panel according to claim 14, further comprising:

a guide line, connected to the turning line, the turning line being located between the guide line and the signal line, wherein the guide line comprises a first guide line to a kth guide line substantially extending along a fifth direction, k being a positive integer and k being greater than or equal to 1, line widths of the first guide line to the kth guide line are $E_1$ to $E_k$, respectively, spacing between a cth guide line and a (c+1)th guide line is $Y_c$, and c is an integer of 1 to (k−1), wherein $$\frac{Y_{k-1}}{E_k + Y_{k-1}} \geq 30\%.$$

18. The display panel according to claim 17, further comprising:
   a connection line, comprising a first connection line to a pth connection line substantially extending along a sixth direction, p being a positive integer and p being greater than or equal to 2, and the connection line being connected to the guide line; and
   a transmission line, comprising a first transmission line to a qth transmission line substantially extending along a seventh direction, q being a positive integer and q being greater than or equal to 2, and the transmission line being connected to the connection line, the connection line being located between the transmission line and the guide line.

19. The display panel according to claim 17, further comprising:
   a connection line, extending along a sixth direction, the connection line being electrically connected to the guide line, the connection line not overlapping the sealant, and the connection line being of a solid structure; and
   a transmission line, comprising a first transmission line to a qth transmission line substantially extending along a seventh direction, q being a positive integer and q being greater than or equal to 2, and the transmission line being connected to the connection line.

20. The display panel according to claim 14, further comprising:
   a driving control unit, located on the first substrate; and
   an output line, extending along an eighth direction, the output line being electrically connected to the driving control unit and overlapping the sealant, and the output line comprising a wavy first output line.

21. The display panel according to claim 20, further comprising a fan-out line extending along a ninth direction, wherein the fan-out line is connected to the output line, the fan-out line does not overlap the sealant, and the fan-out line is of a solid structure.

22. The display panel according to claim 20, further comprising a linear second output line, the first output line overlapping the second output line, and a plurality of openings being provided between the first output line and the second output line.

23. The display panel according to claim 14, wherein m is greater than or equal to 3, the second turning line is located between the first turning line and the mth turning line, and a line width of the second turning line is greater than a line width of the first turning line and a line width of the mth turning line.

24. The display panel according to claim 14, wherein a common boundary between the turning line and the signal line is substantially parallel with a third direction, a first auxiliary region is defined by the first direction, a fourth direction perpendicular to the first direction, and the third direction, one side of the first auxiliary region overlaps the common boundary, two vertices of the first auxiliary region overlap the first signal line and the other vertex of the first auxiliary region overlaps the nth signal line, the signal line comprises a first auxiliary electrode provided between the first and nth signal lines and the common boundary in the first auxiliary region, the first auxiliary electrode is connected to at least one of the first signal line to the nth signal line, a vertical projection area of the signal line in the first auxiliary region is A1, an area of the first auxiliary region is B1, and 60%≤A1/B1≤100%.

\* \* \* \* \*